(12) United States Patent
Burak et al.

(10) Patent No.: US 9,621,126 B2
(45) Date of Patent: Apr. 11, 2017

(54) BULK ACOUSTIC RESONATOR DEVICE INCLUDING TEMPERATURE COMPENSATION STRUCTURE COMPRISING LOW ACOUSTIC IMPEDANCE LAYER

(71) Applicant: Avago Technologies General IP (Singapore) Pte. Ltd., Singapore (SG)

(72) Inventors: Dariusz Burak, Fort Collins, CO (US); Qiang Zou, Fort Collins, CO (US); Genichi Tsuzuki, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 27 days.

(21) Appl. No.: 14/521,406

(22) Filed: Oct. 22, 2014

(65) Prior Publication Data

US 2016/0118957 A1    Apr. 28, 2016

(51) Int. Cl.
| | |
|---|---|
| *H03H 9/02* | (2006.01) |
| *H01L 41/047* | (2006.01) |
| *H03H 3/007* | (2006.01) |
| *H03H 9/17* | (2006.01) |
| *H03H 3/04* | (2006.01) |

(52) U.S. Cl.
CPC ..... *H03H 9/02102* (2013.01); *H01L 41/0471* (2013.01); *H03H 3/0076* (2013.01); *H03H 9/173* (2013.01); *H03H 9/175* (2013.01); *H03H 2003/0407* (2013.01)

(58) Field of Classification Search
CPC ....... H03H 9/02102; H03H 2003/0407; H03H 3/0076; H03H 9/173; H03H 9/175; H01L 41/0471

USPC .......................... 333/133, 186–188; 310/346
See application file for complete search history.

(56) References Cited

U.S. PATENT DOCUMENTS

| | | |
|---|---|---|
| 5,587,620 A | 12/1996 | Ruby et al. |
| 5,873,153 A | 2/1999 | Ruby et al. |
| 6,107,721 A | 8/2000 | Lakin |
| 6,507,983 B1 | 1/2003 | Ruby et al. |
| 6,828,713 B2 | 12/2004 | Bradley et al. |
| 6,906,451 B2 * | 6/2005 | Yamada ................ C23C 14/10 310/324 |
| 7,280,007 B2 | 10/2007 | Feng et al. |
| 7,345,410 B2 | 3/2008 | Grannen et al. |
| 7,358,831 B2 | 4/2008 | Larson, III et al. |
| 7,388,454 B2 | 6/2008 | Ruby et al. |
| 7,561,009 B2 | 7/2009 | Larson, III et al. |
| 7,562,429 B2 * | 7/2009 | Larson, III ............ H03H 3/02 216/13 |
| 7,629,865 B2 | 12/2009 | Ruby |
| 7,714,684 B2 | 5/2010 | Ruby et al. |
| 7,791,434 B2 | 9/2010 | Fazzio et al. |
| 8,188,810 B2 | 5/2012 | Fazzio et al. |
| 8,230,562 B2 | 7/2012 | Fazzio et al. |
| 8,248,185 B2 | 8/2012 | Choy et al. |
| 8,253,513 B2 | 8/2012 | Zhang |

(Continued)

OTHER PUBLICATIONS

Co-pending U.S. Appl. No. 14/161,564, filed Jan. 22, 2014.

(Continued)

*Primary Examiner* — Robert Pascal
*Assistant Examiner* — Jorge Salazar, Jr.

(57) ABSTRACT

An acoustic resonator device includes a temperature compensation structure disposed beneath the first electrode and above the substrate.

40 Claims, 8 Drawing Sheets

(56) References Cited

U.S. PATENT DOCUMENTS

| | | | |
|---|---|---|---|
| 8,661,899 B2 | 3/2014 | Zolfagharkhani et al. | |
| 2002/0190814 A1* | 12/2002 | Yamada | B06B 1/0644 |
| | | | 333/187 |
| 2005/0057117 A1* | 3/2005 | Nakatsuka | H03H 9/02094 |
| | | | 310/311 |
| 2006/0132262 A1 | 6/2006 | Fazzio et al. | |
| 2006/0226932 A1 | 10/2006 | Fazzio et al. | |
| 2007/0205850 A1 | 9/2007 | Jamneala et al. | |
| 2010/0327994 A1 | 12/2010 | Choy et al. | |
| 2011/0180391 A1 | 7/2011 | Larson, III et al. | |
| 2011/0227671 A1* | 9/2011 | Zhang | H04R 17/00 |
| | | | 333/195 |
| 2011/0266925 A1 | 11/2011 | Ruby et al. | |
| 2012/0177816 A1 | 7/2012 | Larson, III et al. | |
| 2012/0326807 A1 | 12/2012 | Choy et al. | |
| 2013/0049545 A1* | 2/2013 | Zou | H03H 3/04 |
| | | | 310/346 |
| 2014/0361664 A1* | 12/2014 | Taniguchi | H03H 9/02102 |
| | | | 310/346 |

OTHER PUBLICATIONS

Co-pending U.S. Appl. No. 13/662,460, filed Oct. 27, 2012.
Co-pending U.S. Appl. No. 13/906,873, filed May 31, 2013.
Co-pending U.S. Appl. No. 14/191,771, filed Feb. 27, 2014.
HTE Labs, "Plasma Enhanced Chemical Vapor Deposition", Jul. 6, 2009.
Lukacs, "Wirelessly Sensing Resonant Frequency of Passive Resonators with Different Q Factors", 2011.

* cited by examiner

BULK ACOUSTIC RESONATOR DEVICE INCLUDING TEMPERATURE COMPENSATION STRUCTURE COMPRISING LOW ACOUSTIC IMPEDANCE LAYER

BACKGROUND

Electrical resonators are widely incorporated in modern electronic devices. For example, in wireless communications devices, radio frequency (RF) and microwave frequency resonators are used as filters, such as ladder filters having electrically connected series and shunt resonators formed in a ladder structure. The filters may be included in a duplexer, for example, connected between a single antenna and a receiver and a transmitter for respectively filtering received and transmitted signals.

Various types of filters use mechanical resonators, such as bulk acoustic wave (BAW) resonators, including film bulk acoustic resonators (FBARs) and solidly mounted resonators (SMRs), or surface acoustic wave (SAW) resonators. The resonators generally convert electrical signals to mechanical signals or vibrations, and/or mechanical signals or vibrations to electrical signals. A BAW resonator, for example, is an acoustic device comprising a stack that generally includes a layer of piezoelectric material between two electrodes. Acoustic waves achieve resonance across the acoustic stack, with the resonant frequency of the waves being determined by the materials in the acoustic stack and the thickness of each layer (e.g., piezoelectric layer and electrode layers). One type of BAW resonator includes a piezoelectric film as the piezoelectric material, which may be referred to as an FBAR as noted above. FBARs resonate at GHz frequencies, and are thus relatively compact, having thicknesses on the order of microns and length and width dimensions of hundreds of microns.

Resonators may be used as band-pass filters with associated passbands providing ranges of frequencies permitted to pass through the filters. The passbands of the resonator filters tend to shift in response to environmental and operational factors, such as changes in temperature and/or incident power. For example, the passband of a resonator filter moves lower in frequency in response to rising temperature and higher incident power.

Cellular phones, in particular, are negatively affected by shifts in passband due to fluctuations in temperature and power. For example, a cellular phone includes power amplifiers (PAs) that must be able to deal with larger than expected insertion losses at the edges of the filter (duplexer). As the filter passband shifts down in frequency, e.g., due to rising temperature, the point of maximum absorption of power in the filter, which is designed to be above the passband, moves down into the frequency range at which the majority of the power is emitted from the PA. At this point, the filter begins to absorb more power from the PA and heats up, causing the temperature to increase further. Thus, the filter passband shifts down in frequency more, bringing the maximum filter absorbing point even closer. This sets up a potential runaway situation, which is avoided only by the fact that the reflected power becomes large and the filter eventually settles at some high temperature. One possible solution to mitigate this run-away situation is to stabilize the spectral location of filter's pass-band with respect to temperature changes.

PAs are designed specifically to handle the worst case power handling of the filter at the corner of the pass band. Currents of a typical PA can run from a few mA at the center of the filter passband to about 380 mA-450 mA at the edges. This is a significant power draw on the PA, as well as the battery that drives the cellular phone and is even more pronounced if the filter's maximum absorption point moves towards the frequency range where the RF power emitted from the PA is the largest. This may be one of the reasons that a cellular phone operating more in the transmit mode (i.e., talk time) than in the receive mode (i.e., listening time) drains battery power more quickly. Moreover, power consumption disparity between transmitter PA and receiver PA is because transmitted power needs to reach the base station that may be located at a distance requiring elevated levels of RF power emitted by the cell-phone.

Increased power consumption can result in increased operating temperatures that can adversely impact the operating frequency of acoustic resonators used in filters and other components of RF "front-end," such as power amplifiers. In addition, frequency down-shift of filter's passband may cause unwanted interference with other passbands designated either by FCC or the government. Such situation occurs e.g. for so-called sliver bands 13 and 30 in the US. In particular, sliver band require filters with are temperature compensated and have a very narrow passbands (of the order of 1-3%). Currently available piezoelectric materials (e.g. aluminum nitride, zinc oxide, scandium-doped aluminum nitride) are generally feasible for designing optimized non temperature compensated filters with passbands approximately 2-3 times wider. Implementing temperature compensation and narrowing the pass-band of the filter to meet the sliver bands requirements generally results in poorly performing resonators (low quality factor Q) and filters (degraded insertion and rejection losses) comprising these resonators.

What is needed, therefore, is a BAW resonator that overcomes at least the shortcomings of known BAW resonators described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased or clarity of discussion. Wherever applicable and practical, like reference numerals refer to like elements.

DETAILED DESCRIPTION

Figure 1A:
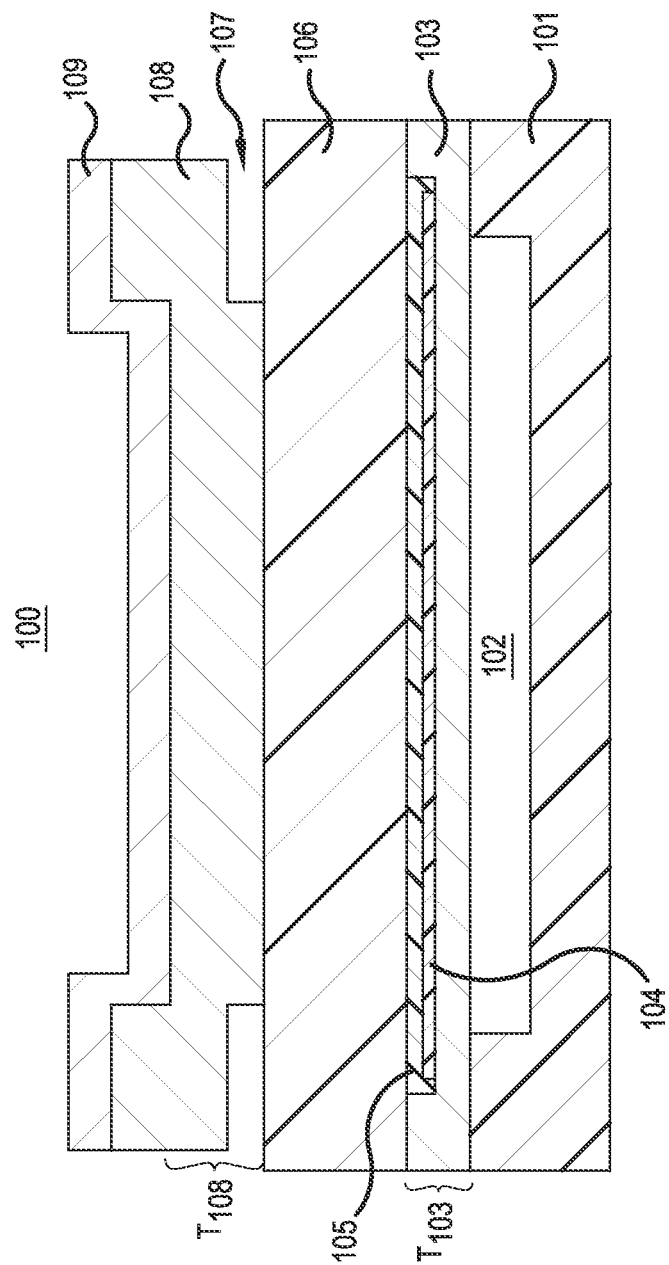
FIG. 1A is a cross-sectional diagram illustrating a BAW resonator device according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

Aspects of the present teachings are relevant to components of BAW resonator devices and filters, their materials and their methods of fabrication. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,629,865, 7,714,684 to Ruby et al.; U.S. Pat. Nos. 7,791,434 8,188,810, and 8,230,562 to Fazzio, et al.; U.S. Pat. No. 7,280,007 to Feng et al.; U.S. Pat. No. 8,248,185 to Choy, et al.; U.S. Pat. No. 7,345,410 to Grannen, et al.; U.S. Pat. No. 6,828,713 to Bradley, et al.; U.S. Pat. No. 7,561,009 to Larson, et al.; U.S. Patent Application Publication No. 20120326807 to Choy, et al.; U.S. Patent Application Publication No. 20100327994 to Choy, et al.; U.S. Patent Application Publications Nos. 20110180391 and 20120177816 to Larson III, et al.; U.S. Patent Application Publication No. 20070205850 to Jamneala et al.; U.S. Patent Application Publication No. 20110266925 to Ruby, et al.; U.S. patent application Ser. No. 14/161,564 entitled: "Method of Fabricating Rare-Earth Element Doped Piezoelectric Material with Various Amounts of Dopants and a Selected C-Axis Orientation," filed on Jan. 22, 2014 to John L. Larson III; U.S. patent application Ser. No. 13/662,460 entitled "Bulk Acoustic Wave Resonator having Piezoelectric Layer with Multiple Dopants," filed on Oct. 27, 2012 to Choy, et al.; U.S. patent application Ser. No. 13/906,873 entitled "Bulk Acoustic Wave Resonator having Piezoelectric Layer with Varying Amounts of Dopants" to John Choy, et al. and filed on May 31, 2013; and U.S. patent application Ser. No. 14/191,771, entitled "Bulk Acoustic Wave Resonator having Doped Piezoelectric Layer" to Feng, et al. and filed on Feb. 27, 2014. The entire disclosure of each of the patents, published patent applications and patent application listed above are hereby specifically incorporated by reference herein. It is emphasized that the components, materials and method of fabrication described in these patents and patent applications are representative and other methods of fabrication and materials within the purview of one of ordinary skill in the art are also contemplated.

In accordance with a representative embodiment, a bulk acoustic wave (BAW) resonator comprises a substrate comprising an acoustic reflector; a first electrode disposed over the substrate, the first electrode having a first acoustic impedance; a piezoelectric layer disposed over the first electrode; a second electrode disposed over the piezoelectric layer, the second electrode having a second acoustic impedance; and a temperature compensation structure disposed beneath the first electrode and above the substrate. The temperature compensation structure comprises: a first layer; and a second layer having a third acoustic impedance that is lower than the first and the second acoustic impedances. As described more fully below, and among other characteristics of the BAW resonators of the representative embodiments, the materials selected for inclusion in the temperature compensation structure, and the structure itself combine to improve the frequency response over a desired temperature range of operation, while limiting the temperature-induced frequency response of the BAW resonator (and thus filters comprising the BAW resonators of the representative embodiments) to a comparatively narrow range.

According to various embodiments, FIG. 1A is a cross-sectional view of BAW resonator device 100, which includes an electrode having a temperature compensation structure layer, according to a representative embodiment.

Referring to FIG. 1A, illustrative BAW resonator device 100 includes acoustic stack formed over a substrate 101. The acoustic stack comprises a first electrode 103, a piezoelectric layer 106 and a second electrode 108. The second electrode 108 comprises a cantilevered portion 107 (also known as a wing) disposed along at least one side, if not all sides thereof. The second electrode 108 may be connected on a connection side (not shown) that comprises a bridge (not shown). The cantilevered portion is described, for example in U.S. Pat. No. 8,248,185 referenced above, and the bridge is described in 20120326807, referenced above.

A passivation layer 109, which may be formed of various types of materials, including AlN, silicon carbide (SiC), BSG, $SiO_2$, SiN, polysilicon, and the like, may be disposed over the second electrode 108. The thickness of the passivation layer must be sufficient to insulate all layers of the acoustic stack from the environment, including protection from moisture, corrosives, contaminants, debris and the like. The first and second electrodes 103 and 108 are electrically connected to external circuitry via contact pads (not shown), which may be formed of a conductive material, such as gold, gold-tin alloy or the like.

In the presently described representative embodiment, the first electrode 103 comprises multiple layers, and may be referred to herein as a composite electrode. In various embodiments, the first electrode 103 comprises a temperature compensation structure comprising a first layer 104, and a second layer 105 stacked sequentially beneath the piezoelectric layer 106.

The substrate 101 may be formed of various types of semiconductor materials compatible with semiconductor processes, such as silicon (Si), gallium arsenide (GaAs), indium phosphide (InP), or the like, which is useful for integrating connections and electronics, thus reducing size and cost. In the depicted embodiment, the substrate 101 comprises a cavity 102 formed beneath the acoustic stack to provide acoustic isolation, such that the acoustic stack is suspended over an air space to enable mechanical movement. In alternative embodiments, the substrate 101 may be formed with no cavity, for example, using SMR technology. For example, the acoustic stack may be formed over an acoustic mirror such as a Distributed Bragg Reflector (not shown in FIG. 1A), having alternating layers of high and low acoustic impedance materials, formed in the substrate 101. An acoustic reflector may be fabricated according to various techniques, an example of which is described in U.S. Pat. No. 7,358,831 to Larson, III, et al., which is hereby incorporated by reference.

The first electrode 103 comprises one or more electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example.

In various embodiments, first layer 104 comprises a material having an acoustic impedance that is less than the acoustic impedance of either the first electrode 103 or the second electrode 108. Moreover, the second layer 105 comprises a material having an acoustic impedance that is approximately the same as or higher than the acoustic impedance of the first layer 104. Stated somewhat differently, the first layer 104, is made of material that has positive temperature coefficient offsetting the negative temperature coefficients of the second layer 105, the first electrode 103, the second electrode 108 and the piezoelectric layer 106. As such, the first layer 104 has temperature coefficient selected to offset the negative temperature coefficients of the other layers comprising acoustic stack. Notably, some benefits to BAW resonator device 100 electrical performance resulting form forming the second layer 105 with material having relatively low acoustic impedance as compared to other layers in FBAR 100 (notably, the first electrode 103, the piezoelectric layer 106, the second electrode 108 and the passivation layer 109) are described in connection with FIG. 1B below.

The second layer 105 comprises a material that is substantially inert to etchants used during processing of the BAW resonator device 100. As such, the second layer 105, which extends along the vertical sides of the first layer 104, and thus encapsulates the first layer 104, serves as an etch stop and usefully substantially prevents the etching of the first layer 104 during processing of the BAW resonator device 100, such as during the removal of sacrificial layers provided in the cavity 102 and under the second electrode 108 during the forming of the cantilevered portion 107 and bridge (not shown).

The first layer 104 may be formed of various materials compatible with semiconductor processes, including undoped silicon glass (USG) (e.g., silicon dioxide ($SiO_2$)), boron silicate glass (BSG), chromium (Cr) or tellurium oxide ($TeO_{(x)}$, for example, which have positive temperature coefficients. The positive temperature coefficient of the first layer 104 offsets negative temperature coefficients of other materials in the acoustic stack, including the second layer 105, the piezoelectric layer 106, the first electrode 103 and the second electrode 108. Various illustrative techniques for forming a temperature compensating layer or structure are described, for example, in above-referenced U.S. Pat. No. 7,561,009 to Larson, III, et al. As described more fully below, for the purpose of lowering the coupling coefficient ($kt^2$) of the stack (required, e.g., by so-called "sliver band" applications of RF filters and duplexers), the second layer 105 may be formed of various dielectric materials compatible with semiconductor processes, including non-etchable borosilicate glass (NEBSG), silicon carbide (SiC), aluminum oxide ($Al_2O_3$), diamond, diamond like carbon (DLC) and silicon nitride (SiN) and may be formed using a sputtering, evaporation or CVD technique, for example.

As described in above-referenced U.S. Patent Application Publication No. 20110266925, by "shorting" a parasitic series capacitance in a conductive interposer, a coupling coefficient ($kt^2$) of the BAW resonator device described therein, can be comparatively increased while providing temperature compensation. As can be appreciated from a review of the temperature compensation structure, a parasitic series capacitance is introduced through the inclusion of first and second layers 104, 105, which are generally formed of dielectric materials, between the first and second electrodes 103, 108. As such, the coupling coefficient ($kt^2$) of the BAW resonator device 100 is comparatively reduced due to additional voltage drop across piezoelectrically non-active dielectric regions of the first and second layers 104 and 105. In a representative embodiment, the coupling coefficient ($kt^2$) of the BAW resonator device 100 is in the range of approximately 1.0% to approximately 4%. As will be appreciated by one of ordinary skill in the art, the reduction in the coupling coefficient ($kt^2$) of the BAW resonator device 100 reduces the passband of filters comprising the BAW resonator device 100. For example, in so-called "sliver" operating bands (e.g., around 750 MHz for Band 13 or 2.5 GHz for Band 30), the narrow frequency ranges of operation are desired. By incorporating the temperature compensation structure comprising the first and second layers 104, 105, BAW resonator device 100 can be used to provide filters that operate quite well in such narrow passbands (in the range of from approximately 1% to approximately 3% of the central pass-band frequency), and with substantially complete temperature compensation.

The piezoelectric layer 106 is formed over the second layer 105 and the first electrode 103. The piezoelectric layer 106 may be formed of a thin film piezoelectric compatible with semiconductor processes, such as aluminum nitride (AlN), zinc oxide (ZnO), lead zirconium titanate (PZT), or the like. The thickness of the piezoelectric layer 106 may range from about 1000 Å to about 100,000 Å, for example, although the thickness may vary to provide unique benefits for any particular situation or to meet application specific design requirements of various implementations, as would be apparent to one of ordinary skill in the art. In an embodiment, the piezoelectric layer 106 may be formed on a seed layer (not shown) disposed over an upper surface the first electrode 103. For example, the seed layer may be formed of Al to foster growth of an AlN piezoelectric layer 106. The seed layer may have a thickness in the range of about 50 Å to about 5000 Å, for example.

Notably, forming the piezoelectric layer 106 over the second layer 105 can reduce the quality of the crystalline structure of the piezoelectric layer 106. Specifically, the second layer 105 generally comprises a material that is less than optimal in the formation of a highly textured piezoelectric layer having a well-defined crystalline orientation. As such, the overall quality of the piezoelectric layer 106 formed over the second layer 105 is reduced compared to the that formed over the first electrode 103, which with or without a seed layer formed thereover, provides a better surface over which to grow a highly textured piezoelectric layer. Such a piezoelectric layer is thus not highly textured, as a comparatively reduced piezoelectric coupling coefficient ($e_{33}$), and, as a result, has a comparatively reduced coupling coefficient ($kt^2$). As such, with the desired end of a representative embodiment of having a comparatively narrow passband, the less than highly textured piezoelectric layer 106 results in a reduced coupling coefficient ($kt^2$) in the BAW resonator device 100 and a comparatively narrow passband. For example, depositing the piezoelectric layer 106 over the second layer 105 may lower the coupling coefficient ($kt^2$) by approximately 0.5% to approximately 3% as compared to coupling coefficient ($kt^2$) of a highly textured piezoelectric layer.

The second electrode 108 is formed over the piezoelectric layer 106. The second electrode 108 is formed of an electrically conductive material compatible with semiconductor processes, such as Mo, W, Al, Pt, Ru, Nb, Hf, or the like. In an embodiment, the second electrode 108 is formed of the same material as the first electrode 103. However, in various embodiments, the second electrode 108 may be formed of a different material than the second electrode 108, without departing from the scope of the present teachings.

In an embodiment, an overall first thickness $T_{103}$ of the first electrode 103 including the first and second layers 104, 105 is substantially the same as an overall second thickness $T_{108}$ of the second electrode 108, as shown in FIG. 1A. For example, the thickness of each of the first and second electrodes 103 and 108 may range from about 600 Å to about 30000 Å, although the thicknesses may vary to provide unique benefits for any particular situation or to meet application specific design requirements of various implementations, as would be apparent to one of ordinary skill in the art.

The multiple layers of the first electrode 103 have corresponding thicknesses. For example, the thickness of first electrode 103 beneath the first and second layers 104, 105 of the temperature compensation structure may range from about 400 Å to about 30,000 Å, the thickness of first layer may range from approximately 100 Å to about 5000 Å, and the thickness of the second layer 105 may range from about 100 Å to about 10000 Å. Each of the layers of the first electrode 103 may be varied to produce different characteristics with respect to temperature coefficients and coupling coefficients, while the overall first thickness $T_{103}$ of the first electrode 103 remains substantially the same as the overall second thickness $T_{108}$ of the second electrode 108. For example, the thickness of the first or second layers 104, 105 may be varied to affect the overall temperature coefficient of the acoustic stack, or to affect the parasitic series capacitance and thus the coupling coefficient ($kt^2$) of the BAW resonator device 100.

Notably, the topology of various layers shown in FIGS. 1A-6 may vary from that which is depicted. For example, in FIG. 1A first and second layers 104, 105 may be terminated with sloped rather than vertical edges, such as disclosed in U.S. Patent Application Publication No. 2011026692. Therefore, the piezoelectric layer 106 would wrap around the edges of second layer 105, resulting in non-planar, gradually sloping down (in proximity of the sloped edge (not shown) of second layer 105) top surface of the piezoelectric layer 106. However, since that non-planarity would occur outside of the active region of the BAW resonator device 100, it would not have any significant impact of electrical performance of the BAW resonator device 100 of the representative embodiments (related, to cut-off frequencies, coupling coefficient ($kt^2$), or quality factor Q, for example) and therefore such non-essential topological variations have been omitted from FIGS. 1-6.

Figure 1B:
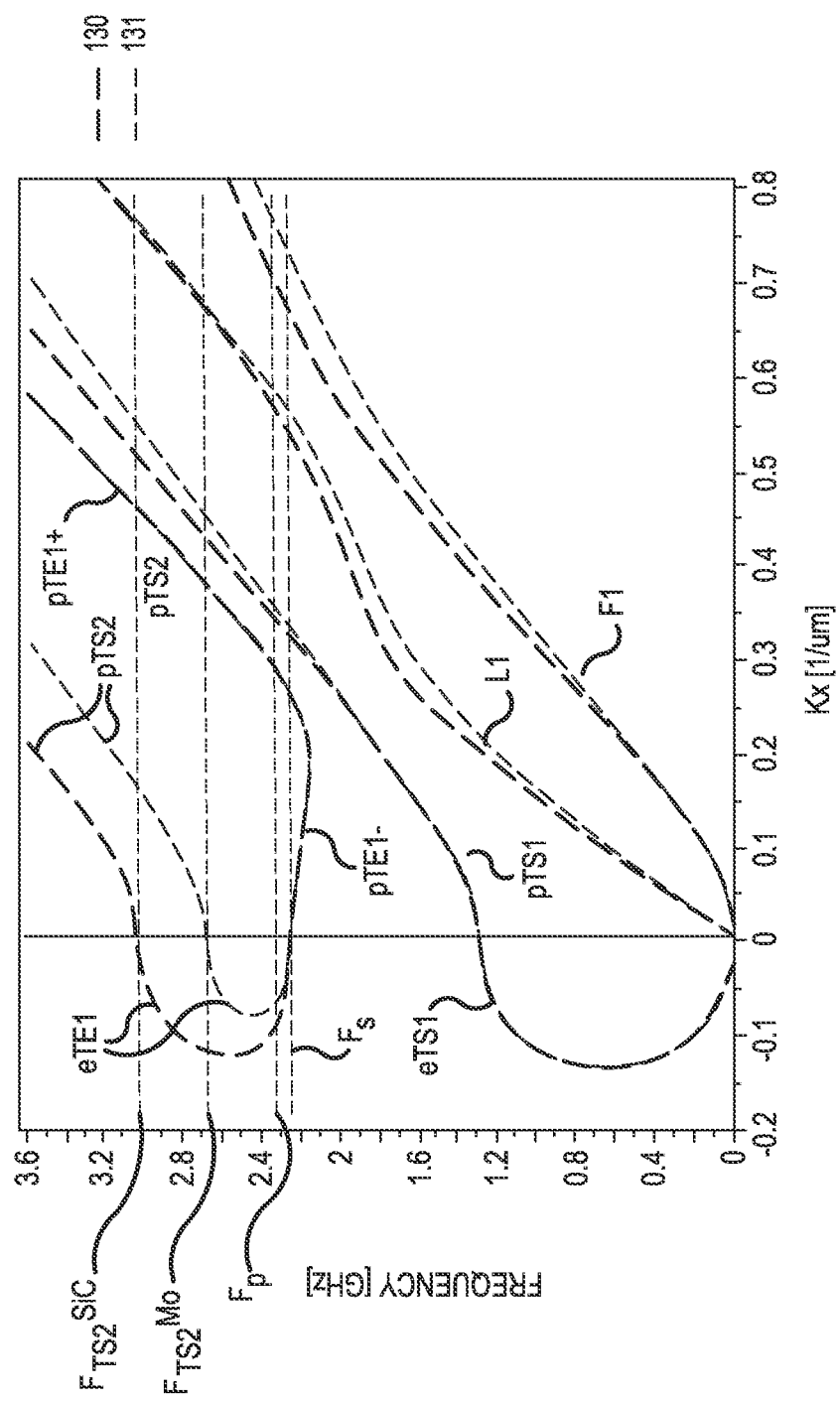
FIG. 1B is an acoustic dispersion diagram illustrating simulated vibrational modes of a reference acoustic resonator and an acoustic resonator according to representative embodiment at different frequencies.

FIG. 1B shows acoustic dispersion diagrams (lateral wave number $k_x$ versus frequency) illustrating simulated vibrational modes of a reference BAW resonator device and BAW resonator device 100 according to a representative embodiment, at different operating frequencies. Specifically, curves 130 show the lateral wave number $k_x$ versus frequency for an illustrative BAW resonator device 100 and curves 131 show lateral wave number $k_x$ versus frequency for a reference BAW resonator device.

In this illustrative example, the BAW resonator device 100 comprises first electrode 103 having molybdenum (Mo) with a thickness of approximately 2300 Å; the first layer 104 comprising undoped silica glass (USG) having a thickness of approximately 800 Å; the second layer 105 comprising sputtered silicon carbide (SiC) having a thickness of approximately 1500 Å; the piezoelectric layer 106 comprising aluminum nitride (AlN) having a thickness of approximately 4500 Å; the second electrode 108 comprising Mo having a thickness of approximately 3000 Å; and the passivation layer 109 comprising AlN having thickness of approximately 3000 Å.

The reference BAW resonator device comprises the same stack as BAW resonator device 100, but the second layer 105 is formed of Mo having a thickness of approximately 1500 Å. Stated somewhat differently, the only difference between acoustic stacks of BAW resonator device 100 and reference BAW resonator device is the material used to form the second layer 105. In reference BAW resonator device, the second layer 105 is formed of Mo having relatively high acoustic impedance (approximately 65 Mega-Rayls (MR)) and Poisson ratio (approximately 0.33), while in BAW resonator device 100 the second layer 105 is formed of sputtered SiC having relatively low acoustic impedance (approximately 30 Mega-Rayls) and Poisson ratio (approximately 0.18). Both the reference BAW resonator device and BAW resonator device 100 have comparable series resonance frequencies Fs of approximately 2.3 GHz. However, the reference BAW resonator device has a coupling coefficient ($kt^2$) of approximately 3.4% while BAW resonator device 100 has a coupling coefficient ($kt^2$) of approximately 2.9%. The difference in coupling coefficients $kt^2$ between reference BAW resonator device and BAW resonator device 100 stems from the fact that the comparatively lower acoustic impedance of the second layer 105 in BAW resonator device 100 leads to confining a larger fraction of acoustic energy in that layer as compared to fraction of acoustic energy confined in the comparatively high impedance second layer 105 in the reference BAW resonator device. As a result, the amount of energy confined in the piezoelectric layer 106 (predominantly determining coupling coefficient $kt^2$) is approximately 38% in BAW resonator device 100, as compared to approximately 48% in reference BAW resonator device. In order to facilitate a match as close as practically possible between structures of BAW resonator device 100 and reference BAW resonator device, the simulations assumed that sputtered SiC is a semi-conducting material effectively shorting the first layer 104 in BAW resonator device 100, and that the piezoelectric layer 106 is the same in BAW resonator device 100 and in the reference BAW resonator device.

In FIG. 1B, the horizontal axis corresponds to the lateral wave-number Kx, with positive numbers indicating real Kx values and negative numbers indicating imaginary Kx values. Each point in FIG. 1B corresponds to an eigenmode of a specific acoustic polarization and direction of propagation supported by the respective acoustic stack. Real Kx values (positive Kx) indicate that a given mode is a propagating mode (i.e., it may propagate in a periodic fashion from a point of excitation) while imaginary Kx values (negative Kx) indicate that a given mode is an evanescent mode (e.g., it may decay exponentially from a point of excitation). The sign convention for evanescent (negative sign) and propagating (positive sign) eigenmodes is purely a matter of convenience of the presentation. The propagating equations for acoustic waves in various regions of the reference BAW resonator device and the BAW resonator device 100 admit both signs for each eigenmode solution and the actual selection of the wave-number sign is determined by the appropriate boundary conditions.

The modes illustrated in FIG. 1B include the following: dilatational (L1), flexural (F1), evanescent thickness shear (eTS1), propagating thickness shear (pTS1), propagating thickness extensional with negative group velocity dispersion (pTE1−), propagating thickness extensional with positive group velocity dispersion (pTE1+), evanescent thickness extensional (eTE1), and propagating thickness shear of second order (pTS2). Note that the notation used here does not follow the standard separation of modes into symmetric and anti-symmetric classes because the acoustic stacks comprising acoustic BAW resonator device 100 and the reference BAW resonator device may be significantly more complicated than single layers for which such classification is valid. So called complex evanescent modes are not shown in FIG. 1A for simplicity of presentation. Complex evanescent modes propagate in a periodic fashion from a point of excitation, but their amplitude of the oscillations decays exponentially. Generally, these modes are very short range, meaning that they decay within 1-2 μm from the excitation point and usually do not contribute to radiative energy loss.

Series (Fs), parallel (Fp) and second-order shear ($F_{TS2}$) resonance frequencies are shown as dashed horizontal lines. More specifically, $F_{TS2}^{Mo}$ indicates second-order shear resonance frequency of reference BAW resonator device having the second layer 105 formed of Mo, while $F_{TS2}^{SiC}$ indicates second-order shear resonance frequency of BAW resonator device 100 having the second layer 105 formed of sputtered SiC. Fractional Frequency Separation can be expressed mathematically by the following equation (1):

$$FFS = 100*(F_{TS2}-F_S)/F_S [\%] \quad (1)$$

The significance of FFS in minimization of radiative losses at parallel resonance frequency Fp and maximization of parallel resistance Rp relies on an overlap (or degree of similarity) between Mason pseudo-mode and eTE1 eigenmode throughout the acoustic stack of reference BAW resonator device or BAW resonator device 100. The Mason pseudo-mode is a specific distribution of longitudinal Uz displacement throughout the acoustic stack of reference BAW resonator device or BAW resonator device 100 produced by vertical voltage applied between first and second electrodes 103 and 108, respectively. On the dispersion diagram shown in FIG. 1B the Mason pseudo-mode may be represented as a vertical line at Kx=−0, which corresponds to spatially uniform distribution of Uz in a lateral direction of reference BAW resonator device or BAW resonator device 100. For that reason, the Mason pseudo-mode may be also referred to as a piston mode. Note that Mason pseudo-mode does not have any shear Ux displacement component at any frequency of operation, and is the $1^{st}$ order thickness extensional mode around Fs, meaning that longitudinal Uz displacement has one null close to the center of the stack while the bottom and top of the stack are displaced in the opposite direction with respect to their initial (that is without applied voltage) position. On the other hand, pTE1−, eTE1 and pTS2 modes belong to a family of $1^{st}$ order thickness extensional and $2^{nd}$ order thickness shear mode, meaning that longitudinal Uz displacement has one null close to the center of the stack (similarly to the Mason pseudo-mode) and shear Ux displacement has two nulls inside the stack.

As frequency changes from below Fs to above $F_{TS2}$ in FIG. 1A the dominant polarization of the mode represented by pTE1−, eTE1 and pTS2 branches changes from predominantly longitudinal around Fs frequency to predominantly shear around $F_{TS2}$ frequency, and at the same time the mode order changes from predominantly $1^{st}$ order around Fs frequency to predominantly $2^{nd}$ order around $F_{TS2}$ frequency. In particular, at Fp the eTE1 eigenmode is a mixed longitudinal/shear and $1^{st}/2^{nd}$ order mode, with the specific partitioning of energy between Uz and Ux components depending on frequency separation between $F_{TS2}$ and Fs, and between Fp and Fs, Since for most of the acoustic stacks Fp is relatively close to Fs as compared to $F_{TS2}$, FFS can be used as a simple measure of modal similarity between eTE1 eigen-mode and Mason pseudo-mode. Note that for frequency F in a very close proximity to Fs (F−Fs<<Fp−Fs), the Mason pseudo-mode and eTE1 eigenmode are practically identical. More specifically, FFS for reference BAW resonator device is approximately 18% ($F_{TS2}^{Mo}$ is approximately 2.69 GHz) and FFS for BAW resonator device 100 is approximately 34% ($F_{TS2}^{SiC}$ is approximately 3.04 GHz). Stated somewhat differently, replacement of relatively high acoustic impedance (formed of Mo) second layer 105 in reference BAW resonator device with relatively low acoustic impedance (formed of SiC) second layer in BAW resonator device 100 allows FFS to increase by approximately factor of two. As should be appreciated by one skilled in the art, the main difference in acoustic dispersion diagrams between acoustic stacks of the reference BAW resonator and a the BAW resonator device 100 is in spectral location of $F_{TS2}$ resonance: all other eigenmodal branches (e.g. L1, F1, eTS1, pTS1, pTE1− and TE1+) look substantially similar due to similarity of acoustic stacks comprising reference BAW resonator and a the BAW resonator device 100.

For the reference BAW resonator device or BAW resonator device 100 at parallel resonance frequency Fp, the Uz displacement for Mason pseudo-mode is flat across the second electrode 108 and is terminated abruptly at the edges of the second electrode 108. Since the cutoff frequency for the thickness extensional TE1 resonance in the region outside the second electrode 108 is significantly higher than in the active region, it essentially clamps the total displacement outside of the active region of the BAW resonator device. That clamping requirement enforces (through appropriate stress and particle velocity continuity conditions) suppression of total motion at the edge of the second electrode 108, which may be accomplished primary by mechanical excitation of eTE1 mode in the opposite phase to the Mason pseudo-mode (driven by electric field). As a result, total Uz displacement exhibits evanescent decay towards the electrode edges when looking from the center of the resonator. However, eTE1 mode may not completely suppress total Uz displacement at the edges of the top electrode because it also contains a non-zero shear Ux displacement. Since the Mason pseudo-mode is purely longitudinal, the total shear component of total displacement at the edge of the top electrode is predominantly equal to shear Ux component of eTE1 mode at the top electrode edges. Therefore, incomplete suppression of Mason's pseudo-mode longitudinal Uz displacement component and enhanced excitation of the shear Ux displacement component of the eTE1 eigenmode at the top electrode edges require excitation of other propagating and complex eigenmodes shown, for example, in FIG. 1B, as pTE1, pTS1, L1 and F1 branches for reference BAW resonator device and BAW resonator device 100, to facilitate the necessary stress and particle velocity continuity conditions at the top electrode edge. Propagating, evanescent and complex modes excited in the main active region lead to enhanced localized viscous loss and to the ohmic loss due to Joule heating provided a given mode contains a thickness extensional component. Propagating modes in the region outside of the top electrode lead to acoustic radiation of energy to surrounding regions. All three loss mechanisms (radiative, viscous and ohmic) degrade resonator performance, and in particular lower the parallel resistance Rp and quality factor Q of the BAW resonator device.

As noted above, a predominant reason for enhanced acoustic loss at parallel resonance frequency Fp is inability to completely suppress electrically excited longitudinal displacements of the Mason pseudo-mode with the evanescent eTE1 eigenmode due to the presence of non-zero shear component of the eTE1 eigenmode. However, as noted in connection with FIG. 1B, the amount of shear component in eTE1 eigen-mode is predominantly determined by FFS, that is by the separation of $2^{nd}$ order shear cut-off frequency $F_{TS2}$ from the series resonance frequency Fs. Thus, by redesigning the acoustic stack to increase FFS one may reduce the shear component in eTE1 eigenmode, facilitate more efficient suppression of total motion at the edge of the top electrode, and therefore increase Rp and the Q-factor. As shown in connection with FIG. 1B, replacement of relatively high acoustic impedance (formed of Mo) second layer 105 in reference BAW resonator device with relatively low acoustic impedance (formed of SiC) second layer in BAW resonator device 100 allows to increase FFS by approximately factor of two, resulting in expected increase of parallel resistance Rp and quality factor Qp at parallel resonance Fp in BAW resonator device 100 as compared to the reference BAW resonator device.

Figure 2:
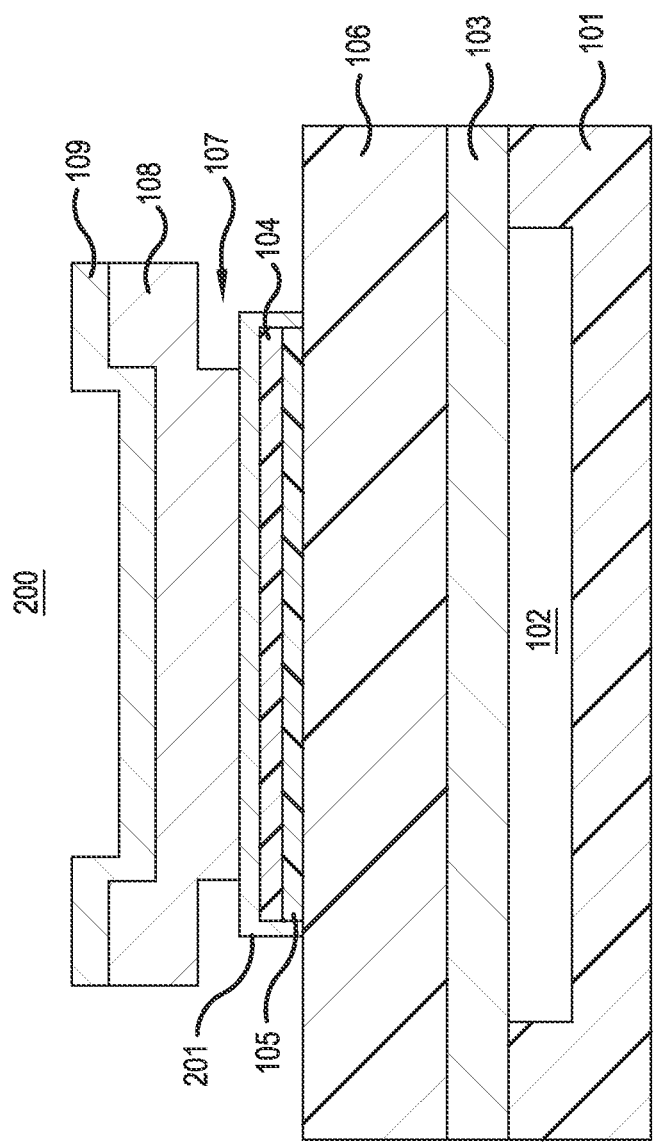
FIG. 2 is a cross-sectional diagram illustrating a BAW resonator device according to a representative embodiment.

According to various embodiments, FIG. 2 is a cross-sectional view of BAW resonator device 200, which includes a temperature compensation structure, according to a representative embodiment.

Referring to FIG. 2, illustrative BAW resonator device 200 includes acoustic stack formed over a substrate 101. Many details of the BAW resonator device 100 described above in connection with representative embodiments are common to those described presently in connection with BAW resonator device 200. Often, these details may not be repeated in order to avoid obscuring the description of the presently described representative embodiments.

The acoustic stack comprises a piezoelectric layer 106 formed between first electrode 103 and second electrode 108. The second electrode 108 comprises cantilevered portion 107 (also known as a wing) disposed along at least one side, if not all sides thereof. The second electrode 108 may be connected on a connection side (not shown) that comprises a bridge (not shown). The cantilevered portion is described, for example in U.S. Pat. No. 8,248,185 referenced above, and the bridge is described in 20120326807, referenced above.

Passivation layer 109, which may be formed of various types of materials, including AlN, silicon carbide (SiC), BSG, $SiO_2$, SiN, polysilicon, and the like, may be disposed over the second electrode 108. The thickness of the passivation layer must be sufficient to insulate all layers of the acoustic stack from the environment, including protection from moisture, corrosives, contaminants, debris and the like.

In the presently described representative embodiment, the first and second layers 104, 105 are disposed over the piezoelectric layer 106 and beneath the second electrode 108. Notably, in order of deposition, the second layer 105 may be formed before the first layer 104 is formed, but for consistency of functionality (namely, the first layer 104 having positive temperature coefficient) the naming convention of FIG. 1 is preserved. In order to provide protection of the first layer 104 from etchants an intermediate layer 201 is provided between the second layer 105 and the second electrode 108, and extends along the sides of the first and second layer 104, 105, making contact to the piezoelectric layer as shown.

Illustratively, the intermediate layer 201 comprises one or more electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example. In addition to providing an electrical path between the second electrode 108 and the piezoelectric layer 106, the intermediate layer 201 serves as an etch stop and usefully substantially prevents the etching of the first layer 104 during processing of the BAW resonator device 100, such as during the removal of sacrificial layers provided in the cavity 102 and under the second electrode 108 during the forming of the cantilevered portion 107 and bridge (not shown). Alternatively, the intermediate layer 201 may be formed of various dielectric materials compatible with semiconductor processes, including non-etchable borosilicate glass (NEBSG), silicon carbide (SiC), aluminum oxide ($Al_2O_3$), diamond, diamond like carbon (DLC) and silicon nitride (SiN). The benefit of forming the intermediate layer 201 with above mentioned dielectric material is in further reducing the coupling coefficient ($kt^2$) if it is desirable by the final application of BAW resonator device 200.

In the depicted embodiment, the substrate 101 comprises cavity 102 formed beneath the acoustic stack to provide acoustic isolation, such that the acoustic stack is suspended over an air space to enable mechanical movement. In alternative embodiments, the substrate 101 may be formed with no cavity, for example, using SMR technology. For example, as noted above, the acoustic stack may be formed over an acoustic mirror such as a Distributed Bragg Reflector (not shown in FIG. 2), having alternating layers of high and low acoustic impedance materials, formed in the substrate 101. An acoustic reflector may be fabricated according to various techniques, an example of which is described in U.S. Pat. No. 7,358,831 to Larson, III, et al., which is hereby incorporated by reference.

The first electrode 103 comprises one or more electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example.

In various embodiments, the first layer 104 comprises a material having an acoustic impedance that is less than the acoustic impedance of either the first electrode 103 or the second electrode 108. Moreover, the second layer 105 comprises a material having an acoustic impedance that is approximately the same as or higher than the acoustic impedance of the first layer 104. Stated somewhat differently, the first layer 104, is formed of material that has positive temperature coefficient offsetting the negative temperature coefficient of the second layer 105, the intermediate layer 201, the first electrode 103, the second electrode 108 and the piezoelectric layer 106. As such, the first layer 104 has temperature coefficients selected to offset the negative temperature coefficients of the other layers comprising the acoustic stack.

The first layer 104 may be formed of various materials compatible with semiconductor processes, including undoped silicon glass (USG) (e.g., silicon dioxide ($SiO_2$)), boron silicate glass (BSG), chromium (Cr) or tellurium oxide ($TeO_{(x)}$), for example, which have positive temperature coefficients. The positive temperature coefficient of the first layer 104 offsets negative temperature coefficients of other materials in the acoustic stack, including the piezoelectric layer 106, the first electrode 103 and the second electrode 108. Various illustrative techniques for forming temperature compensating layer 104 are described, for example, in above mentioned U.S. Pat. No. 7,561,009 to Larson, III, et al. The thickness of the first layer 104' may range 100 Å to about 5000 Å.

As mentioned above in the description of FIG. 1A, the second layer 105 may be formed of various materials compatible with semiconductor processes, including non-etchable borosilicate glass (NEBSG), silicon carbide (SiC), aluminum oxide ($Al_2O_3$), diamond, diamond like carbon (DLC) and silicon nitride (SiN), and these layers may be formed using a sputtering, evaporation or CVD technique, for example. The second layer 105 may have a thickness in the range of about 50 Å to about 5000 Å, for example. Some benefits to the electrical performance of BAW resonator device 200 resulting from forming the second layer 105 with material having relatively low acoustic impedance as compared to other layers in BAW resonator device 200 (notably, the first electrode 103, the piezoelectric layer 106, the second electrode 108 and the passivation layer 109) are similar to these described in connection with FIG. 1B above.

As can be appreciated from a review of the temperature compensation structure, a parasitic series capacitance is introduced through the inclusion of first and second layers 104, 105, which are generally formed of dielectric materials, between the first and second electrodes 103, 108. Unlike the temperature compensation structure of U.S. Patent Application Publication No. 20110266925, this parasitic series capacitance is not shorted or otherwise compensated. As such, because of the additional capacitance in the acoustic stack, a coupling coefficient ($kt^2$) of the BAW resonator device 200 is comparatively reduced due to additional voltage drop across piezoelectrically non-active dielectric regions of the first and seconds layers 104 and 105. In a representative embodiment, the coupling coefficient ($kt^2$) of the BAW resonator device 200 is in the range of approximately 1.0% to approximately 4.0%. As will be appreciated by one of ordinary skill in the art, the reduction in the coupling coefficient ($kt^2$) of the BAW resonator device 200 reduces the passband of filters comprising the BAW resonator device 200. For example, in so-called "sliver" operating bands (e.g., around 750 MHz or 2.5 GHz), the narrow frequency ranges of operation are often desired. By incorporating the temperature compensation structure comprising the first and second layers 104, 105, BAW resonator device 200 can be used to provide filters that operate quite well in such narrow passbands (in the range of from approximately 1% to approximately 3% of the central pass-band frequency), and with approximately complete temperature compensation.

The piezoelectric layer 106 is formed over the second layer 105 and the first electrode 103. The piezoelectric layer 106 may be formed of a thin film piezoelectric compatible with semiconductor processes, such as aluminum nitride (AlN), zinc oxide (ZnO), lead zirconium titanate (PZT), or the like. The thickness of the piezoelectric layer 106 may range from about 1000 Å to about 100,000 Å, for example, although the thickness may vary to provide unique benefits for any particular situation or to meet application specific design requirements of various implementations, as would be apparent to one of ordinary skill in the art. In an embodiment, the piezoelectric layer 106 may be formed on a seed layer (not shown) disposed over an upper surface the first electrode 103. For example, the seed layer may be formed of Al to foster growth of an AlN piezoelectric layer 106. The seed layer may have a thickness in the range of about 50 Å to about 5000 Å, for example.

Figure 3:
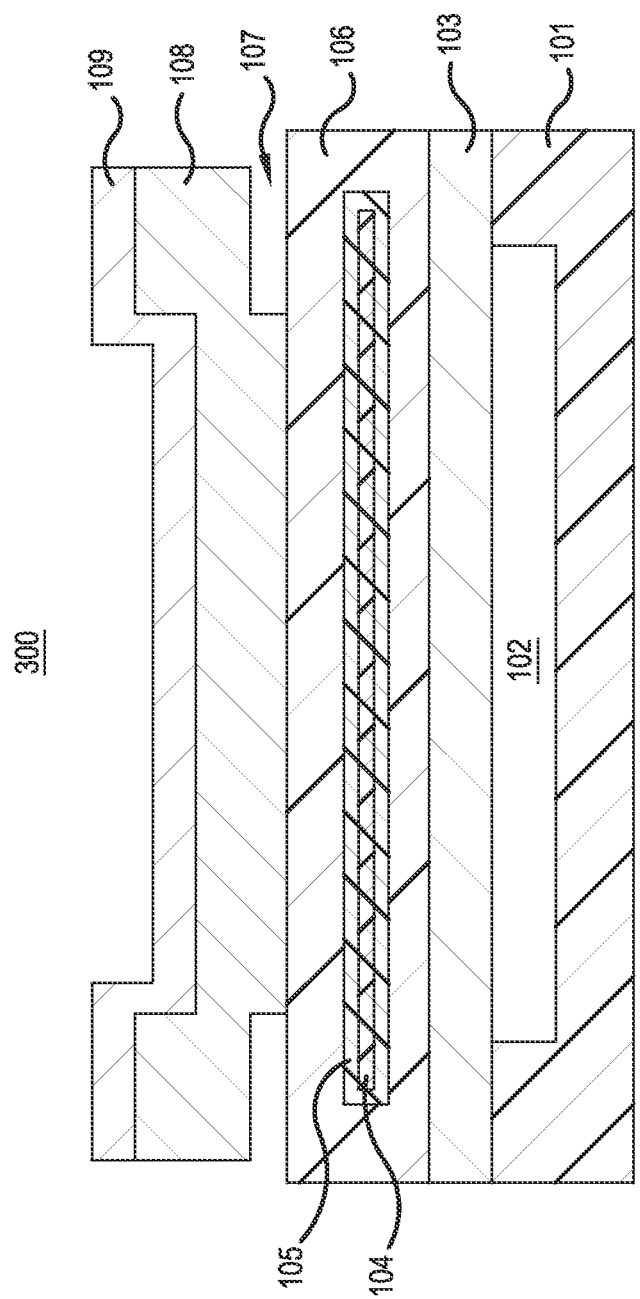
FIG. 3 is a cross-sectional diagram illustrating a BAW resonator device according to a representative embodiment.

According to various embodiments, FIG. 3 is a cross-sectional view of BAW resonator device 300, which includes a temperature compensation structure layer, according to a representative embodiment.

Referring to FIG. 3, illustrative BAW resonator device 300 includes acoustic stack formed over a substrate 101. Many details of the BAW resonator devices 100, 200 described above in connection with representative embodiments are common to those described presently in connection with BAW resonator device 300. Often, these details may not be repeated in order to avoid obscuring the description of the presently described representative embodiments.

The acoustic stack comprises a piezoelectric layer 106 formed between first electrode 103 and second electrode 108. The second electrode 108 comprises cantilevered portion 107 (also known as a wing) disposed along at least one side, if not all sides thereof. The second electrode 108 may be connected on a connection side (not shown) that comprises a bridge (not shown). The cantilevered portion is described, for example in U.S. Pat. No. 8,248,185 referenced above, and the bridge is described in 20120326807, referenced above.

Passivation layer 109, which may be formed of various types of materials, including AlN, silicon carbide (SiC), BSG, $SiO_2$, SiN, polysilicon, and the like, may be disposed over the second electrode 108. The thickness of the passivation layer must be sufficient to insulate all layers of the acoustic stack from the environment, including protection from moisture, corrosives, contaminants, debris and the like.

In the presently described representative embodiment, the first and second layers 104, 105 are disposed in the piezoelectric layer 106 and thus between the first and second electrodes 103, 108. Notably, and as depicted in the cross-sectional view of FIG. 3, second layer 105 substantially encapsulates first layer 104. As noted above, the second layer 105 comprises a material that is substantially inert to etchants used during processing of the BAW resonator device 300. As such, second layer 105 serves as an etch stop and usefully substantially prevents the etching of the first layer 104 during processing of the BAW resonator device 100, such as during the removal of sacrificial layers provided in the cavity 102 and under the second electrode 108 during the forming of the cantilevered portion 107 and bridge (not shown).

In the depicted embodiment, the substrate 101 comprises cavity 102 formed beneath the acoustic stack to provide acoustic isolation, such that the acoustic stack is suspended over an air space to enable mechanical movement. In alternative embodiments, the substrate 101 may be formed with no cavity, for example, using SMR technology. For example, as noted above, the acoustic stack may be formed over an acoustic mirror such as a Distributed Bragg Reflector (not shown in FIG. 3), having alternating layers of high and low acoustic impedance materials, formed in the substrate 101. An acoustic reflector may be fabricated according to various techniques, an example of which is described in U.S. Pat. No. 7,358,831 to Larson, III, et al., which is hereby incorporated by reference.

The first electrode 103 comprises one or more electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example.

As noted above, in various embodiments, first layer 104 comprises a material having an acoustic impedance that is less than the acoustic impedance of either the first electrode 103 or the second electrode 108. Moreover, the second layer 105 comprises a material having an acoustic impedance that is approximately the same as or higher than the acoustic impedance of the first layer 104. Stated somewhat differently, the first layer 104, is made of material that has positive temperature coefficient offsetting the negative temperature coefficients of the second layer 105, the first electrode 103, the second electrode 108 and the piezoelectric layer 106. As such, the first layer 104 has temperature coefficient selected to offset the negative temperature coefficients of the other layers comprising acoustic stack.

The first layer 104 may be formed of various materials compatible with semiconductor processes, including undoped silicon glass (USG) (e.g., silicon dioxide ($SiO_2$)), boron silicate glass (BSG), chromium (Cr) or tellurium oxide ($TeO_{(x)}$), for example, which have positive temperature coefficients. The positive temperature coefficient of the first layer 104 offsets negative temperature coefficients of other materials in the acoustic stack, including the piezoelectric layer 106, the first electrode 103 and the second electrode 108. Various illustrative techniques for forming temperature compensating layer 104 are described, for example, in above mentioned U.S. Pat. No. 7,561,009 to Larson, III, et al. The thickness of the first layer 104 may range 100 Å to about 5000 Å.

As explained in connection with the representative embodiments of FIG. 1A, the second layer 105 may be formed of various materials compatible with semiconductor processes, including non-etchable borosilicate glass (NEBSG), silicon carbide (SiC), aluminum oxide ($Al_2O_3$), diamond, diamond like carbon (DLC) and silicon nitride (SiN), and may be formed using a sputtering, evaporation or CVD technique, for example. The second layer 105 may have a thickness in the range of about 50 Å to about 5000 Å, for example. Certain benefits to electrical performance of BAW resonator device 300 resulting from forming the second layer 105 with material having relatively low acoustic impedance as compared to other layers in BAW resonator device 300 (notably, the first electrode 103, the piezoelectric layer 106, the second electrode 108 and the passivation layer 109) are similar to these described in connection with FIG. 1B above.

As can be appreciated from a review of the temperature compensation structure, a parasitic series capacitance is introduced through the inclusion of first and second layers 104, 105, which are generally formed of dielectric materials, between the first and second electrodes 103, 108. Unlike the temperature compensation structure of U.S. Patent Application Publication No. 20110266925, this parasitic series capacitance is not shorted or otherwise compensated. As such, because of the additional capacitance in the acoustic stack, a coupling coefficient ($kt^2$) of the BAW resonator device 300 is comparatively reduced due to additional voltage drop across piezoelectrically non-active dielectric regions of the first and seconds layers 104 and 105. In a representative embodiment, the coupling coefficient ($kt^2$) of the BAW resonator device 200 is in the range of approximately 1.0% to approximately 4.0%. As will be appreciated by one of ordinary skill in the art, the reduction in the coupling coefficient ($kt^2$) of the BAW resonator device 300 reduces the passband of filters comprising the BAW resonator device 300. For example, in so-called "sliver" operating bands (e.g., around 750 MHz or 2.5 GHz), the narrow frequency ranges of operation are desired. By incorporating the temperature compensation structure comprising the first and second layers 104, 105, BAW resonator device 200 can be used to provide filters that operate quite well in such narrow passbands (in the range of from approximately 1% to approximately 3% of the central pass-band frequency), and with approximately complete temperature compensation.

The piezoelectric layer 106 is formed by a known method, such as one of the methods described in certain incorporated patents, patent application publications or patent applications described above. After formation of an initial amount, the first and second layers 104, 105 are formed by methods described above. The piezoelectric layer formation then continues over the second layer 105. Notably, to provide a symmetric acoustic stack, the first and second layers 104, 105 can be formed after approximately one-half the desired thickness of the piezoelectric layer 106 is formed. The piezoelectric layer 106 may be formed of a thin film piezoelectric compatible with semiconductor processes, such as aluminum nitride (AlN), zinc oxide (ZnO), lead zirconium titanate (PZT), or the like. The thickness of the piezoelectric layer 106 may range from about 1000 Å to about 100,000 Å, for example, although the thickness may vary to provide unique benefits for any particular situation or to meet application specific design requirements of various implementations, as would be apparent to one of ordinary skill in the art. In an embodiment, the piezoelectric layer 106 may be formed on a seed layer (not shown) disposed over an upper surface the first electrode 103. For example, the seed layer may be formed of Al to foster growth of an AlN piezoelectric layer 106. The seed layer may have a thickness in the range of about 50 Å to about 5000 Å, for example.

As noted above, forming the piezoelectric layer 106 over the second layer 105 can reduce the quality of the crystalline structure of the piezoelectric layer 106. Specifically, the second layer 105 generally comprises a material that is less than optimal in the formation of a highly textured piezoelectric layer having a well-defined crystalline orientation. As such, the overall quality of the piezoelectric layer 106 formed over the second layer 105 is reduced compared to the that formed over the first electrode 103, which with or without a seed layer formed thereover, provides a better surface over which to grow a highly textured piezoelectric layer. Such a piezoelectric layer is thus not highly textured, as a comparatively reduced piezoelectric coupling coefficient ($e_{33}$), and, as a result, has a comparatively reduced coupling coefficient ($kt^2$). As such, with the desired end of a representative embodiment of having a comparatively narrow passband, the less than highly textured piezoelectric layer 106 results in a reduced coupling coefficient ($kt^2$) in the BAW resonator device 100 and a comparatively narrow passband. For example, depositing the piezoelectric layer 106 over the second layer 105 may lower the coupling coefficient ($kt^2$) by approximately 0.5% to approximately 3% as compared to coupling coefficient ($kt^2$) of the highly textured piezoelectric layer 106.

Figure 4:
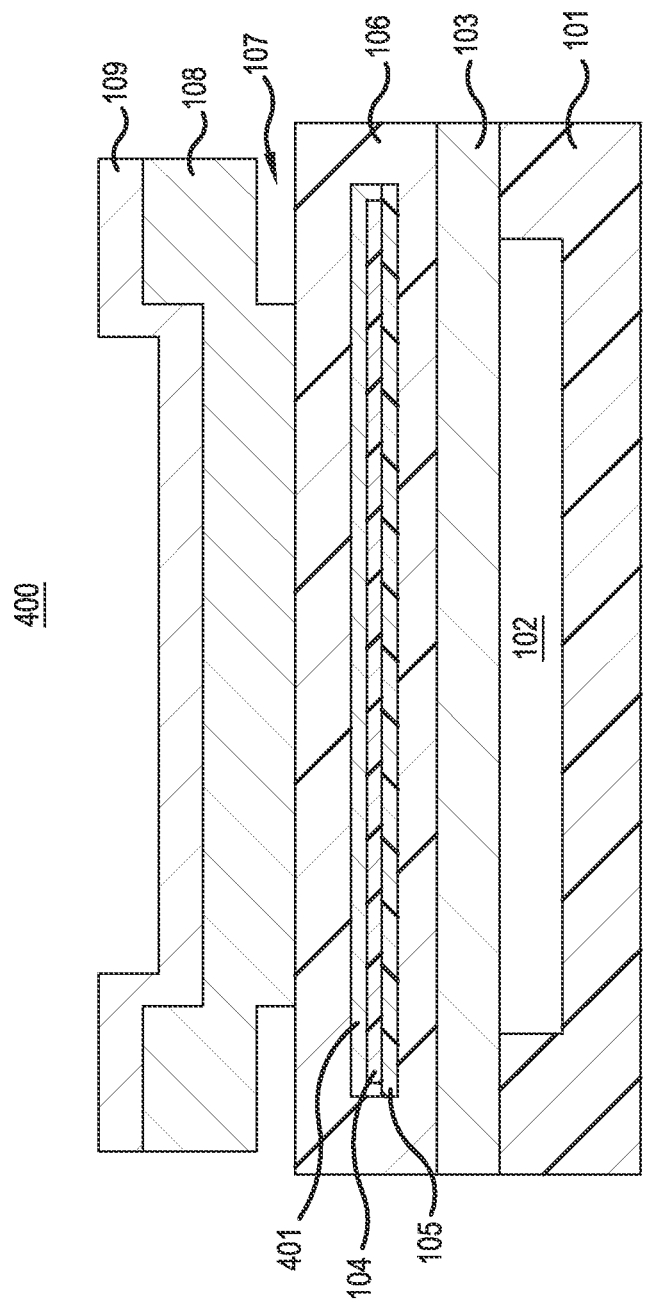
FIG. 4 is a cross-sectional diagram illustrating a BAW resonator device according to a representative embodiment.

According to various embodiments, FIG. 4 is a cross-sectional view of BAW resonator device 400, which includes a temperature compensation structure layer, according to a representative embodiment.

Referring to FIG. 4, illustrative BAW resonator device 400 includes acoustic stack formed over a substrate 101. Many details of the BAW resonator devices 100, 200, 300 described above in connection with representative embodiments are common to those described presently in connection with BAW resonator device 400. Often, these details may not be repeated in order to avoid obscuring the description of the presently described representative embodiments.

The acoustic stack comprises a piezoelectric layer 106 formed between first electrode 103 and second electrode

108. The second electrode 108 comprises cantilevered portion 107 (also known as a wing) disposed along at least one side, if not all sides thereof. The second electrode 108 may be connected on a connection side (not shown) that comprises a bridge (not shown). The cantilevered portion is described, for example in U.S. Pat. No. 8,248,185 referenced above, and the bridge is described in 20120326807, referenced above.

Passivation layer 109, which may be formed of various types of materials, including AlN, silicon carbide (SiC), BSG, SiO$_2$, SiN, polysilicon, and the like, may be disposed over the second electrode 108. The thickness of the passivation layer must be sufficient to insulate all layers of the acoustic stack from the environment, including protection from moisture, corrosives, contaminants, debris and the like.

In the presently described representative embodiment, the first and second layers 104, 105 are disposed in the piezoelectric layer 106 and thus between the first and second electrodes 103, 108. As depicted in the cross-sectional view of FIG. 4, the second layer 105 is provided beneath the first layer 104. An intermediate layer 401 is provided over the first layer 104, extends on the sides of the first layer 104, and together with second layer 105 substantially encapsulates first layer 104. Like second layer 105, the intermediate layer 401 comprises a material that is substantially inert to etchants used during processing of the BAW resonator device 400. As such, the intermediate layer 401 and the second layer 105 serve as an etch stop and usefully substantially prevents the etching of the first layer 104 during processing of the BAW resonator device 100, such as during the removal of sacrificial layers provided in the cavity 102 and under the second electrode 108 during the forming of the cantilevered portion 107 and bridge (not shown).

In the depicted embodiment, the substrate 101 comprises cavity 102 formed beneath the acoustic stack to provide acoustic isolation, such that the acoustic stack is suspended over an air space to enable mechanical movement. In alternative embodiments, the substrate 101 may be formed with no cavity, for example, using SMR technology. For example, as noted above, the acoustic stack may be formed over an acoustic mirror such as a Distributed Bragg Reflector (not shown in FIG. 4), having alternating layers of high and low acoustic impedance materials, formed in the substrate 101. An acoustic reflector may be fabricated according to various techniques, an example of which is described in U.S. Pat. No. 7,358,831 to Larson, III, et al., which is hereby incorporated by reference.

The first electrode 103 comprises one or more electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example.

As noted above, in various embodiments, first layer 104 comprises a material having an acoustic impedance that is less than the acoustic impedance of either the first electrode 103 or the second electrode 108. Moreover, the second layer 105 comprises a material having an acoustic impedance that is approximately the same as or higher than the acoustic impedance of the first layer 104. Furthermore, the intermediate layer 401 comprises a material having a negative temperature coefficient, and may be formed of a material used to form either the first electrode 103 or the second electrode 108. Stated somewhat differently, the first layer 104, is made of material that has positive temperature coefficient offsetting the negative temperature coefficient of the second layer 105, the intermediate layer 401, the first electrode 103, the second electrode 108 and the piezoelectric layer 106. As such, the first layer 104 has temperature coefficients selected to offset the negative temperature coefficients of other layers comprising the acoustic stack.

The first layer 104 may be formed of various materials compatible with semiconductor processes, including undoped silicon glass (USG) (e.g., silicon dioxide (SiO$_2$)), boron silicate glass (BSG), chromium (Cr) or tellurium oxide (TeO$_{(x)}$), for example, which have positive temperature coefficients. The positive temperature coefficient of the first layer 104 offsets negative temperature coefficients of other materials in the acoustic stack, including the piezoelectric layer 106, the first electrode 103 and the second electrode 108. Various illustrative techniques for forming temperature compensating layer 104 are described, for example, in above mentioned U.S. Pat. No. 7,561,009 to Larson, III, et al. The thickness of the first layer 104 may range 100 Å to about 5000 Å.

As mentioned above in relation to FIG. 1A, the second layer 105 may be formed of various materials compatible with semiconductor processes, including non-etchable borosilicate glass (NEBSG), silicon carbide (SiC), aluminum oxide (Al$_2$O$_3$), diamond, diamond like carbon (DLC) and silicon nitride (SiN), and may be formed using a sputtering, evaporation or CVD technique, for example. The second layer 105 may have a thickness in the range of about 50 Å to about 5000 Å, for example. Again, certain benefits to the electrical performance of BAW resonator device 400 resulting from forming the second layer 105 with material having relatively low acoustic impedance as compared to other layers in BAW resonator device 400 (notably, the first electrode 103, the piezoelectric layer 106, the second electrode 108 and the passivation layer 109) are similar to these described in connection with FIG. 1B above.

The intermediate layer 401 may also be formed of various materials compatible with semiconductor processes, including tungsten (W), molybdenum (Mo), aluminum (Al), platinum (Pt), ruthenium (Ru), niobium (Nb), or hafnium (Hf), for example.

As can be appreciated from a review of the temperature compensation structure, a parasitic series capacitance is introduced through the inclusion of first and second layers 104, 105, which are generally formed of dielectric materials, between the first and second electrodes 103, 108. Notably, growth of the piezoelectric layer 106 is disrupted in order to form first and second layers 104, 105. After formation of the first and second layers 104, 105, formation of the piezoelectric layer 106 resumes. As will be appreciated by one of ordinary skill in the art, the disruption of the growth of the piezoelectric layer 106 combined with the additional surface (i.e., the surface of the intermediate layer 401) over which the growth of the piezoelectric layer 106 continues can be detrimental to the quality/crystalline orientation of the resultant piezoelectric layer 106 formed over the intermediate layer 401. This compromised quality can adversely impact the performance of the BAW resonator device 400 and any filter incorporating the BAW resonator device 400. On the other hand, the acoustic impedance of the intermediate layer 401 may be lower than that of the piezoelectric layer 106 formed in this interrupted process and may therefore improve the confinement of acoustic energy in the central portion of the acoustic stack, resulting in better overall performance of BAW resonator device 400 due to increased FFS number described in connection with FIG. 1B. However, the more likely scenario would be reduced performance of the BAW resonator device 400 due to the compromised quality of the piezoelectric layer 106 formed over the intermediate layer 401.

Unlike the temperature compensation structure of U.S. Patent Application Publication No. 20110266925, this parasitic series capacitance is not shorted or otherwise compensated. As such, because of the additional capacitance in the acoustic stack, a coupling coefficient ($kt^2$) of the BAW resonator device 300 is comparatively reduced due to additional voltage drop across piezoelectrically non-active dielectric regions of the first and seconds layers 104 and 105. In a representative embodiment, the coupling coefficient ($kt^2$) of the BAW resonator device 400 is in the range of approximately 1.0% to approximately 4.0%. As will be appreciated by one of ordinary skill in the art, the reduction in the coupling coefficient ($kt^2$) of the BAW resonator device 400 reduces the passband of filters comprising the BAW resonator device 400. For example, in so-called "sliver" operating bands (e.g., around 750 MHz or 2.5 GHz), the narrow frequency ranges of operation are desired. By incorporating the temperature compensation structure comprising the first and second layers 104, 105, BAW resonator device 400 can be used to provide filters that operate quite well in such narrow passbands (in the range of from approximately 1% to approximately 3% of the central pass-band frequency), and with approximately complete temperature compensation.

The piezoelectric layer 106 is formed by a known method, such as one of the methods described in certain incorporated patents, patent application publications or patent applications described above. After formation of an initial amount, the first and second layers 104, 105 are formed by methods described above. Next, the intermediate layer 401 is provided over the first layer 104, and makes contact with the second layer 105. The piezoelectric layer formation then continues over the intermediate layer 401. Notably, to provide a symmetric acoustic stack, the first and second layers 104, 105, and the intermediate layer 401 can be formed after approximately one-half the desired thickness of the piezoelectric layer 106 is formed and may be formed of material with acoustic impedance lower than the acoustic impedance of the piezoelectric layer 106.

The piezoelectric layer 106 may be formed of a thin film piezoelectric compatible with semiconductor processes, such as aluminum nitride (AlN), zinc oxide (ZnO), lead zirconium titanate (PZT), or the like. The thickness of the piezoelectric layer 106 may range from about 1000 Å to about 100,000 Å, for example, although the thickness may vary to provide unique benefits for any particular situation or to meet application specific design requirements of various implementations, as would be apparent to one of ordinary skill in the art. In an embodiment, the piezoelectric layer 106 may be formed on a seed layer (not shown) disposed over an upper surface the first electrode 103. For example, the seed layer may be formed of Al to foster growth of an AlN piezoelectric layer 106. The seed layer may have a thickness in the range of about 50 Å to about 5000 Å, for example.

As noted above, forming the piezoelectric layer 106 over the second layer 105 can reduce the quality of the crystalline structure of the piezoelectric layer 106. In the presently described embodiment, the intermediate layer 401 is selected from a material that is more conducive to forming a crystalline structure of better quality. While the introduction of the first and second layers 104, 105 can present issues with forming a highly textured piezoelectric layer having a well-defined crystalline orientation, the inclusion of the intermediate layer 401 fosters better growth. As such, because the piezoelectric layer 106 is of a better crystalline nature than if the intermediate layer 401 were not used, a somewhat improved piezoelectric coupling coefficient ($e_{33}$), and, as a result, has a comparatively reduced coupling coefficient ($kt^2$) can be realized. Therefore, the degradation of the piezoelectric coupling coefficient ($e_{33}$), and coupling coefficient ($kt^2$) is somewhat limited only by the parasitic series capacitance introduced by the temperature compensation structure. Accordingly, the piezoelectric coupling coefficient ($e_{33}$), and coupling coefficient ($kt^2$) can somewhat be tailored to a specific need to provide a certain narrow passband filter using BAW resonator device 400.

Figure 5:
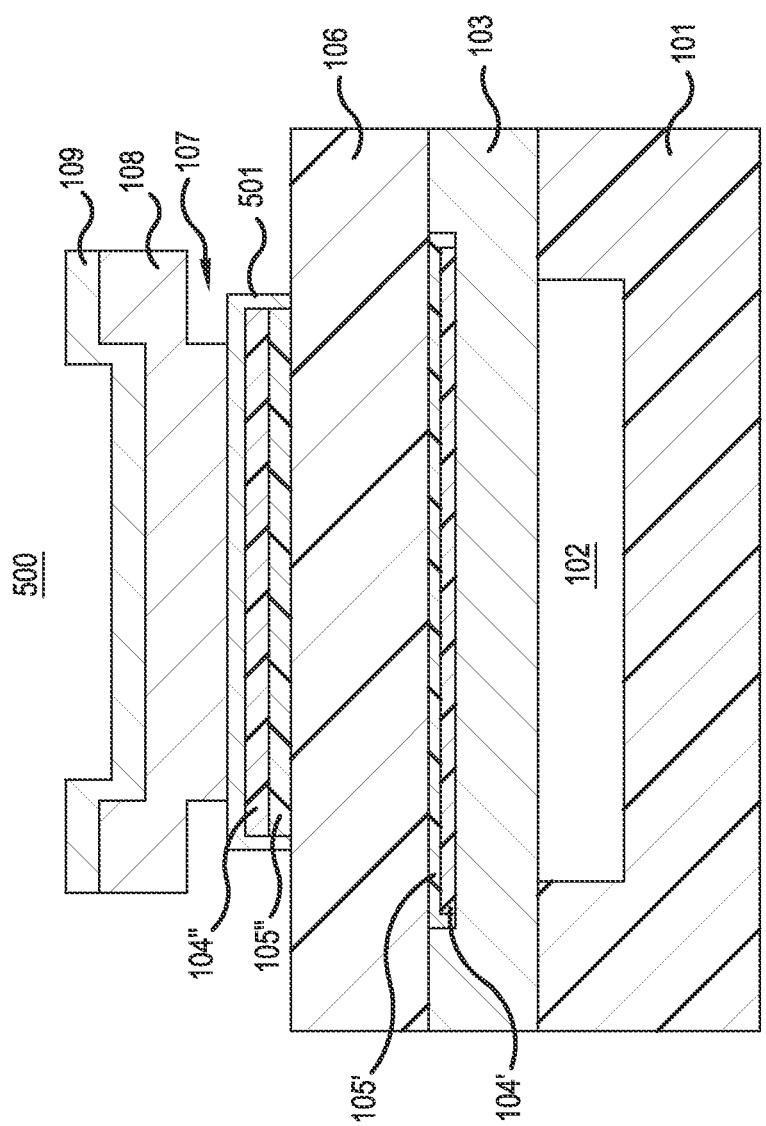
FIG. 5 is a cross-sectional diagram illustrating a BAW resonator device according to a representative embodiment.

According to various embodiments, FIG. 5 is a cross-sectional view of BAW resonator device 500, which includes a temperature compensation structure layer, according to a representative embodiment.

Referring to FIG. 5, illustrative BAW resonator device 500 includes acoustic stack formed over a substrate 101. Many details of the BAW resonator devices 100, 200, 300, 400 described above in connection with representative embodiments are common to those described presently in connection with BAW resonator device 500. Often, these details may not be repeated in order to avoid obscuring the description of the presently described representative embodiments.

According to various embodiments, FIG. 5 is a cross-sectional view of BAW resonator device 500, which includes an electrode having a temperature compensation structure layer, according to a representative embodiment.

Referring to FIG. 5, illustrative BAW resonator device 500 includes acoustic stack formed over a substrate 101. The acoustic stack comprises piezoelectric layer 106 formed between first electrode 103 and second electrode 108. The second electrode 108 comprises cantilevered portion 107 (also known as a wing) disposed along at least one side, if not all sides thereof. The second electrode 108 may be connected on a connection side (not shown) that comprise a bridge (not shown). The cantilevered portion 107 is described, for example in U.S. Pat. No. 8,248,185 referenced above, and the bridge is described in 20120326807, referenced above.

Passivation layer 109, which may be formed of various types of materials, including AlN, silicon carbide (SiC), BSG, $SiO_2$, SiN, polysilicon, and the like, may be disposed over the second electrode 108. The thickness of the passivation layer must be sufficient to insulate all layers of the acoustic stack from the environment, including protection from moisture, corrosives, contaminants, debris and the like. The first and second electrodes 103 and 108 are electrically connected to external circuitry via contact pads (not shown), which may be formed of a conductive material, such as gold, gold-tin alloy or the like.

In the presently described representative embodiment, the first electrode 103 comprises multiple layers, and may be referred to herein as a composite electrode. In various embodiments, the first electrode 103 comprises a temperature compensation structure comprising a first layer 104', and a second layer 105' stacked sequentially beneath the piezoelectric layer 106.

The substrate 101 may be formed of various types of semiconductor materials compatible with semiconductor processes, such as silicon (Si), gallium arsenide (GaAs), indium phosphide (InP), or the like, which is useful for integrating connections and electronics, thus reducing size and cost. In the depicted embodiment, the substrate 101 comprises a cavity 102 formed beneath the acoustic stack to provide acoustic isolation, such that the acoustic stack is suspended over an air space to enable mechanical movement. In alternative embodiments, the substrate 101 may be formed with no cavity, for example, using SMR technology.

For example, the acoustic stack may be formed over an acoustic mirror such as a Distributed Bragg Reflector (not shown in FIG. 5), having alternating layers of high and low acoustic impedance materials, formed in the substrate 101. An acoustic reflector may be fabricated according to various techniques, an example of which is described in U.S. Pat. No. 7,358,831 to Larson, III, et al., which is hereby incorporated by reference.

The first electrode 103 comprises one or more electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example.

In various embodiments, first layer 104' comprises a material having an acoustic impedance that is less than the acoustic impedance of either the first electrode 103 or the second electrode 108. Moreover, the second layer 105' comprises a material having an acoustic impedance that is approximately the same as or higher than the acoustic impedance of the first layer 104'. Stated somewhat differently, the first layer 104' is made of material that has positive temperature coefficient offsetting the negative temperature coefficients of the second layer 105', the first electrode 103, the second electrode 108 and the piezoelectric layer 106. As such, the first layer 104' has temperature coefficient selected to partially offset the negative temperature coefficients of the other layers comprising acoustic stack.

The BAW resonator also comprises a third layer 104" and a fourth layer 105" are disposed over the piezoelectric layer 106 and beneath the second electrode 108. In order to maintain an electrical contact between the second electrode 108 and the piezoelectric layer 106, an intermediate layer 501 is provided between the second layer 105 and the second electrode 108, and extends along the sides of the first and second layer 104, 105, making contact to the piezoelectric layer as shown.

In accordance with a representative embodiment, the third layer 104" is substantially the same as the first layer 104' and the fourth layer 105" is substantially the same as the second layer 105'. As such, third layer 104" comprises a material having an acoustic impedance that is substantially the same as the first layer 104' and is lower than the acoustic impedance of either the first electrode 103 or the second electrode 108. Moreover, the fourth layer 105" comprises a material having an acoustic impedance that is substantially the same as the second layer 105' and approximately the same as or higher than the acoustic impedance of the third layer 104". Stated somewhat differently, the first and third layers 104', 104" are made of materials that have positive temperature coefficient offsetting the negative temperature coefficients of the second and the fourth layers 105', 105", the first electrode 103, the second electrode 108 and the piezoelectric layer 106. As such, the first and the third layers 104', 104" have temperature coefficients selected to offset the negative temperature coefficients of the other layers comprising the acoustic stack.

The first layer 104' and the third layer 104" may be formed of various materials compatible with semiconductor processes, including undoped silicon glass (USG) (e.g., silicon dioxide ($SiO_2$)), boron silicate glass (BSG), chromium (Cr) or tellurium oxide ($TeO_{(x)}$), for example, which have positive temperature coefficients. The positive temperature coefficient of the first layer 104 offsets negative temperature coefficients of other materials in the acoustic stack, including the piezoelectric layer 106, the first electrode 103 and the second electrode 108. Various illustrative techniques for forming temperature compensating layer 104 are described, for example, in above mentioned U.S. Pat. No. 7,561,009 to Larson, III, et al. The thicknesses of the first layer 104' and the third layer 104" may range from approximately 100 Å to approximately 5000 Å.

As mentioned above in relation to FIG. 1A, the second layer 105' and the fourth layer 105" may also be formed of various materials compatible with semiconductor processes, including non-etchable borosilicate glass (NEBSG), silicon carbide (SiC), aluminum oxide ($Al_2O_3$), diamond, diamond like carbon (DLC) and silicon nitride (SiN), and may be formed using a sputtering, evaporation or CVD technique, for example. The thicknesses of the second layer 105' and the fourth layer 105" may range from about 50 Å to about 5000 Å. Certain benefits to the electrical performance of BAW resonator device 500 resulting from forming the second and the fourth layers 105' and 105" with material having relatively low acoustic impedance as compared to other layers in BAW resonator device 500 (notably, the first electrode 103, the piezoelectric layer 106, the second electrode 108 and the passivation layer 109) are similar to these described in connection with FIG. 1B above.

The intermediate layer 401 may also be formed of various materials compatible with semiconductor processes, including tungsten (W), molybdenum (Mo), aluminum (Al), platinum (Pt), ruthenium (Ru), niobium (Nb), or hafnium (Hf), for example. The intermediate layer 401 may have a thickness in the range of about 50 Å to about 5000 Å, for example.

As noted above, the inclusion of the first and second layers 104', 105' in the first electrode 103 and beneath the piezoelectric layer 106 results in parasitic series capacitance in the BAW resonator device 500. Similarly, a parasitic series capacitance is introduced through the inclusion of third and fourth layers 104", 105", which are generally formed of dielectric materials, between the first and second electrodes 103, 108. These parasitic series capacitances degrade the coupling coefficient ($kt^2$) due to additional voltage drop across piezoelectrically non-active dielectric regions of the first and third layers 104', 104" and 105', 105". Likewise, forming the piezoelectric layer 106 over the second layer 105' is less than optimal in the formation of a highly textured piezoelectric layer having a well-defined crystalline orientation. As such, the overall quality of the piezoelectric layer 106 formed over the second layer 105' is reduced compared to the that formed over the first electrode 103, which with or without a seed layer formed thereover, provides a better surface over which to grow a highly textured piezoelectric layer. Such a piezoelectric layer is thus not highly textured, as a comparatively reduced piezoelectric coupling coefficient ($e_{33}$), and, as a result, has a comparatively reduced coupling coefficient ($kt^2$). As such, with the desired end of a representative embodiment of having a comparatively narrow passband, the less than highly textured piezoelectric layer 106 results in a reduced coupling coefficient ($kt^2$) in the BAW resonator device 500 and a comparatively narrow passband.

Notably, however, the combined thicknesses of the first through fourth layers 104"-105" is substantially the same as the thicknesses of the first and second layers 104, 105 in BAW resonator devices 100, 200. As such, the overall parasitic series capacitance is substantially the same in BAW resonator device 500 as in BAW resonator devices 100, 200. However, acoustic stack comprising first electrode 103, first and second layers 104', 105', piezoelectric layer 106, third and fourth layers 104", 105" and second electrode 108 is substantially symmetric about an axis of symmetry bisecting the piezoelectric layer 106. More specifically, symmetrization of acoustic energy distribution with respect to the geometrical center of the stack may allow for more efficient use of acoustic energy confinement features like so-called 'wings' and 'frame elements', resulting in improved quality factor Q of the BAW resonator. Examples of 'wings' and 'frame elements' used in BAW resonator devices of the present teachings will be described in connection with representative embodiments of FIG. 6 below. As should be appreciated by one skilled in the art, these features are optimized for BAW resonators, which are not temperature compensated and which generally include bottom electrode, piezoelectric layer, top electrode and the passivation layer. In such BAW resonators, the peak of acoustic energy occurs generally close to the geometrical center of the stack (in vertical direction). Introduction of temperature compensating structure, for example as in BAW resonator device 100, creates asymmetry in the energy distribution across the acoustic stack of the BAW resonator device 100 by introducing another energy peak in the first layer 104, due to the lowest acoustic impedance of the first layer 104 in the acoustic stack. Such asymmetric energy distribution across the acoustic stack of the BAW resonator device 100 generally leads to lowered FFS described in connection with FIG. 1B, leading to lower parallel resistance and quality factor Qp at parallel resonance frequency Fp, The detrimental impact of an asymmetric energy distribution on FFS and resonator performance may be minimized by placing another temperature compensating structure over the piezoelectric layer, such as described in connection with the representative embodiments of FIG. 5. Another approach to provide a symmetric acoustic energy distribution across the acoustic stack and increase FFS even further is to place the temperature compensation structure inside the piezoelectric layer, such as described in connection with the representative embodiments of FIG. 4. However, as noted above such approach may deteriorate the quality of the piezoelectric layer 106 grown over the temperature compensating structure comprising the first layer 104, the second layer 105 and the intermediate layer 401 in BAW resonator device 400. Thus, the actual processing cost and performance comparisons between asymmetric BAW resonator devices 100, 200 and 300, and symmetric BAW resonator devices 400 and 500 may be used to determine which design would be used in final application.

Figure 6:
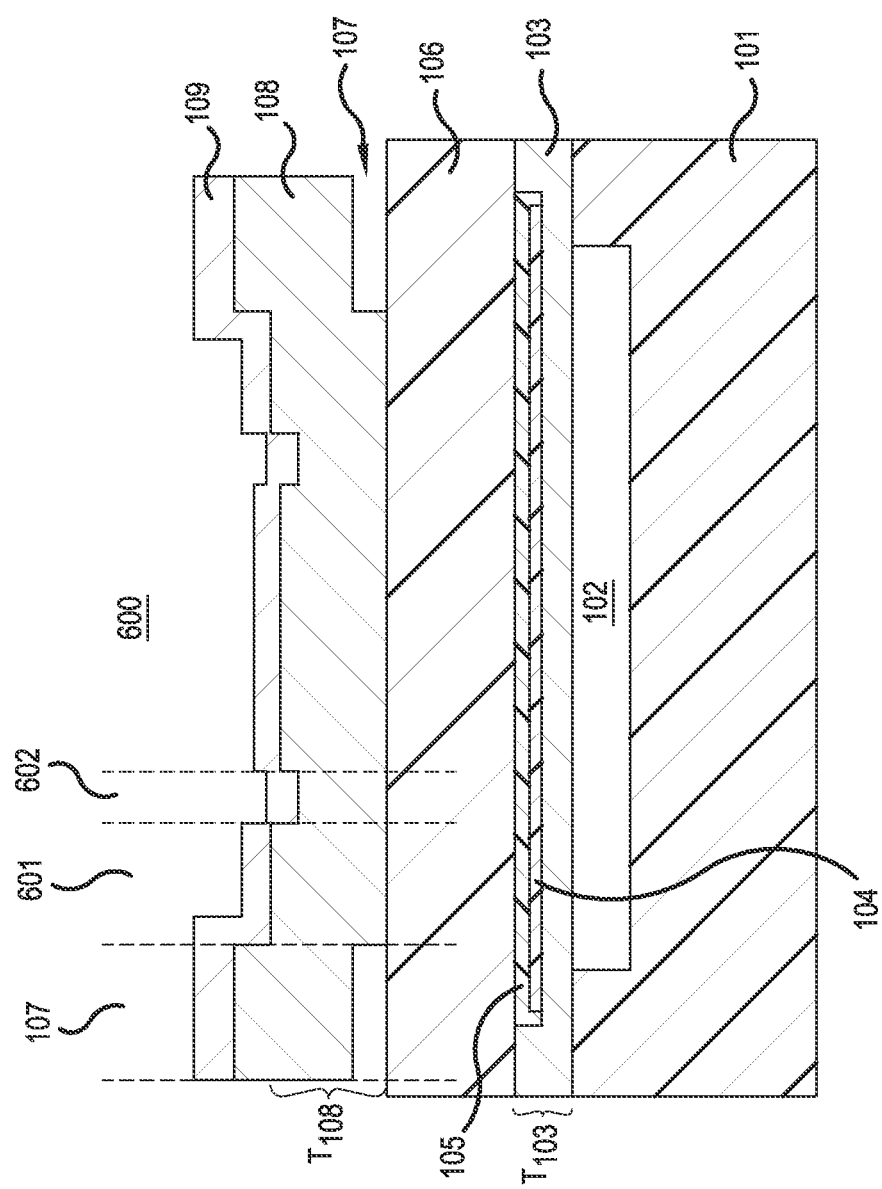
FIG. 6 is a cross-sectional diagram illustrating a BAW resonator device according to a representative embodiment.

According to various embodiments, FIG. 6 is a cross-sectional view of BAW resonator device 600, which includes an electrode having a temperature compensation structure layer, according to a representative embodiment. Many details of the BAW resonator devices 100~500 described above in connection with representative embodiments are common to those described presently in connection with BAW resonator device 600. Often, these details may not be repeated in order to avoid obscuring the description of the presently described representative embodiments.

Referring to FIG. 6, illustrative BAW resonator device 600 includes acoustic stack formed over substrate 101. The acoustic stack comprises first electrode 103, piezoelectric layer 106 and second electrode 108. The second electrode 108 comprises cantilevered portion 107 (also known as a wing) disposed along at least one side, if not all sides thereof. The second electrode 108 may be connected on a connection side (not shown) that comprise a bridge (not shown). The cantilevered portion is described, for example in U.S. Pat. No. 8,248,185 referenced above, and the bridge is described in 20120326807, referenced above.

Passivation layer 109, which may be formed of various types of materials, including AlN, silicon carbide (SiC), BSG, $SiO_2$, SiN, polysilicon, and the like, may be disposed over the second electrode 108. The thickness of the passivation layer 109 must be sufficient to insulate all layers of the acoustic stack from the environment, including protection from moisture, corrosives, contaminants, debris and the like. The first and second electrodes 103 and 108 are electrically connected to external circuitry via contact pads (not shown), which may be formed of a conductive material, such as gold, gold-tin alloy or the like.

In the presently described representative embodiment, the first electrode 103 comprises multiple layers, and may be referred to herein as a composite electrode. In various embodiments, the first electrode 103 comprises a temperature compensation structure comprising a first layer 104, and a second layer 105 stacked sequentially beneath the piezoelectric layer 106.

The substrate 101 may be formed of various types of semiconductor materials compatible with semiconductor processes, such as silicon (Si), gallium arsenide (GaAs), indium phosphide (InP), or the like, which is useful for integrating connections and electronics, thus reducing size and cost. In the depicted embodiment, the substrate 101 comprises a cavity 102 formed beneath the acoustic stack to provide acoustic isolation, such that the acoustic stack is suspended over an air space to enable mechanical movement. In alternative embodiments, the substrate 101 may be formed with no cavity, for example, using SMR technology. For example, the acoustic stack may be formed over an acoustic mirror such as a Distributed Bragg Reflector (not shown in FIG. 6), having alternating layers of high and low acoustic impedance materials, formed in the substrate 101. An acoustic reflector may be fabricated according to various techniques, an example of which is described in U.S. Pat. No. 7,358,831 to Larson, III, et al., which is hereby incorporated by reference.

The first electrode 103 comprises one or more electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example.

In various embodiments, first layer 104 comprises a material having an acoustic impedance that is less than the acoustic impedance of either the first electrode 103 or the second electrode 108. Moreover, the second layer 105 comprises a material having an acoustic impedance that is approximately the same as or higher than the acoustic impedance of the first layer 104. Stated somewhat differently, the first layer 104, is made of material that has positive temperature coefficient offsetting the negative temperature coefficients of the second layer 105, the first electrode 103, the second electrode 108 and the piezoelectric layer 106. As such, the first layer 104 has temperature coefficient selected to offset the negative temperature coefficients of the other layers comprising acoustic stack.

BAW resonator device 600 also comprises a raised frame element 601 (sometimes referred to as an "outie") and a recessed frame element 602 (sometimes referred to as an "innie") disposed along most if not all sides of the second electrode 108. Further details of the use, formation and benefits of the raised frame element 601 and the recessed frame element 602 are found for example, above-referenced in commonly owned U.S. Pat. No. 7,280,007 to Feng, et al.; commonly owned U.S. Pat. Nos. 8,230,562; 8,188,810; 7,791,434 to Fazzio, et al.; commonly owned U.S. Pat. No. 7,714,684 to Ruby, et al.; commonly owned U.S. Patent Application Publication 20070205850 entitled "Piezoelectric Resonator Structure and Electronic Filters having Frame Elements" to Jamneala, et al. Again, the disclosures of these patents and patent application publication are specifically incorporated herein by reference. As is known, the raised frame element 601 and the recessed frame element 602 provide an acoustic mismatch at the perimeter of the second electrode 108, improve signal reflections and reduce acoustic losses. Ultimately, reduced losses translate into an improved Q-factor of the device. While the raised frame element 601 and the recessed frame element 602 are shown on the second electrode 108, these features may instead be provided on the first electrode 103, or selectively on both the first and second electrodes 103,108.

The inclusion of the raised and recessed frame elements 601, 602 is not limited to BAW resonator structure of FIG. 6. Rather, the raised and recessed frame elements 601, 602 are contemplated for use in BAW resonator devices 100~600.

Figure 7:
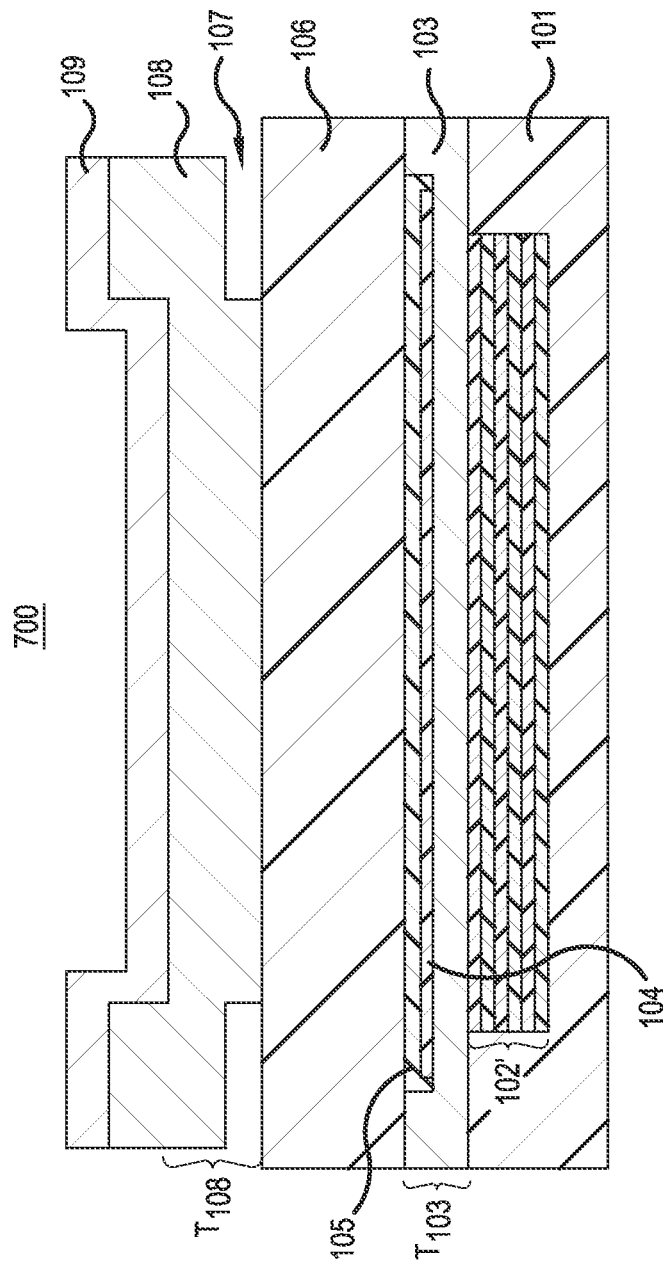
FIG. 7 is a cross-sectional diagram illustrating a BAW resonator device according to a representative embodiment.

According to various embodiments, FIG. 7 is a cross-sectional view of BAW resonator device 700, which includes an electrode having a temperature compensation structure layer, according to a representative embodiment. Many details of the BAW resonator devices 100~600 described above in connection with representative embodiments are common to those described presently in connection with BAW resonator device 700. Often, these details may not be repeated in order to avoid obscuring the description of the presently described representative embodiments.

Referring to FIG. 7, illustrative BAW resonator device 700 includes acoustic stack formed over a substrate 101. As alluded to above, the BAW resonators of the representative embodiments can be formed over a cavity (and thus are FBARs) or over an acoustic mirror, such as a distributed Bragg reflector (and thus as SMRs), which are known to one of ordinary skill in the art. The BAW resonator device 700 is illustratively formed over a distributed Bragg reflector 102', which comprises alternating layers of low acoustic impedance and high acoustic impedance materials. An acoustic reflector may be fabricated according to various techniques, an example of which is described in U.S. Pat. No. 7,358,831 to Larson, III, et al., which is hereby incorporated by reference.

The acoustic stack comprises first electrode 103, piezoelectric layer 106 and second electrode 108. The second electrode 108 comprises a cantilevered portion 107 (also known as a wing) disposed along at least one side, if not all sides thereof. The second electrode 108 may be connected on a connection side (not shown) that comprise a bridge (not shown). The cantilevered portion is described, for example in U.S. Pat. No. 8,248,185 referenced above, and the bridge is described in 20120326807, referenced above.

The BAW resonator device 700 comprises first layer 104, which comprises a material having an acoustic impedance that is less than the acoustic impedance of either the first electrode 103 or the second electrode 108. Moreover, the second layer 105 comprises a material having an acoustic impedance that is approximately the same as or higher than the acoustic impedance of the first layer 104. As noted above, the first layer 104, is made of material that has positive temperature coefficient offsetting the negative temperature coefficients of the layers used to form distributed Bragg reflector 102', second layer 105, the first electrode 103, the second electrode 108 and the piezoelectric layer 106. As such, the first layer 104 has temperature coefficient selected to offset the negative temperature coefficients of the other layers comprising acoustic stack.

The inclusion of the distributed Bragg reflector 102' instead of cavity 102 is not limited to BAW resonator structure of FIG. 7. Rather, the distributed Bragg reflector 102' is contemplated for use instead of the cavity 102 in BAW resonator devices 200-600.

According to various embodiments, an acoustic stack of a BAW resonator device comprises a temperature compensation structure. The temperature compensation structure has a temperature coefficient that has an opposite sign from a temperature coefficient of at least one other element in the acoustic stack, thus offsetting the effects of that temperature coefficient.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A bulk acoustic wave (BAW) resonator, comprising:
a substrate comprising an acoustic reflector;
a first electrode disposed over the substrate, the first electrode having a first acoustic impedance;
a piezoelectric layer disposed over the first electrode;
a second electrode disposed over the piezoelectric layer, the second electrode having a second acoustic impedance; and
a temperature compensation structure disposed in the piezoelectric layer, the temperature compensation structure comprising:
a first layer having a positive temperature coefficient; and
a second layer having a third acoustic impedance that is lower than the first and the second acoustic impedances, wherein the second layer substantially encapsulates the first layer.

2. A BAW resonator as claimed in claim 1, wherein the first layer comprises a first dielectric material, and the second layer comprises a second dielectric material.

3. A BAW resonator as claimed in claim 2, wherein the first dielectric material has an acoustic impedance in a range of approximately 5 MR to approximately 50 MR.

4. A BAW resonator as claimed in claim 2, wherein the first dielectric material comprises one of undoped silicate glass (USG) or tetraethyl orthosilicate (TEOS).

5. A BAW resonator as claimed in claim 2, wherein the second dielectric material has an acoustic impedance in a range of approximately 5 MR to approximately 60 MR.

6. A BAW resonator as claimed in claim 2, wherein the second dielectric material comprises one of non-etchable borosilicate glass (NEBSG), silicon carbide (SiC), aluminum oxide ($Al_2O_3$), diamond, diamond like carbon (DLC) and silicon nitride (SiN).

7. A BAW resonator as claimed in claim 1, wherein the first layer comprises a dielectric material, and the second layer comprises a metal or a metal alloy.

8. A BAW resonator as claimed in claim 1, wherein the first layer comprises a dielectric material and the second layer comprises a stack of a plurality of metal layers, or a plurality of metal alloy layers, or both.

9. A BAW resonator as claimed in claim 1, wherein the temperature compensation structure further comprises a third layer with acoustic impedance in a range of approximately 5 MR to approximately 120 MR.

10. A bulk acoustic wave (BAW) resonator, comprising:
a substrate comprising an acoustic reflector;
a first electrode disposed over the substrate, the first electrode having a first acoustic impedance;

a piezoelectric layer disposed over the first electrode;
a second electrode disposed over the piezoelectric layer, the second electrode having a second acoustic impedance; and
a temperature compensation structure not disposed beneath the first electrode, and disposed above the substrate, the temperature compensation structure comprising:
a first layer having a positive temperature coefficient; and a second layer having a third acoustic impedance that is lower than the first and the second acoustic impedances, wherein the first layer, or the second layer, or both, comprises a stack of a plurality of dielectric layers.

11. A BAW resonator as claimed in claim 10, wherein the first layer comprises a first dielectric material, and the second layer comprises a second dielectric material.

12. A BAW resonator as claimed in claim 11, wherein the first dielectric material has an acoustic impedance in a range of approximately 5 MR to approximately 50 MR.

13. A BAW resonator as claimed in claim 11, wherein the first dielectric material comprises one of undoped silicate glass (USG) or tetraethyl orthosilicate (TEOS).

14. A BAW resonator as claimed in claim 11, wherein the second dielectric material has an acoustic impedance in a range of approximately 5 MR to approximately 60 MR.

15. A BAW resonator as claimed in claim 11, wherein the second dielectric material comprises one of non-etchable borosilicate glass (NEBSG), silicon carbide (SiC), aluminum oxide ($Al_2O_3$), diamond, diamond like carbon (DLC) and silicon nitride (SiN).

16. A BAW resonator as claimed in claim 11, wherein the first layer comprises a stack of a plurality of dielectric layers.

17. A BAW resonator as claimed in claim 10, wherein the first layer comprises a dielectric material, and the second layer comprises a metal or a metal alloy.

18. A BAW resonator as claimed in claim 16, wherein the first layer comprises a dielectric material and the second layer comprises a stack of a plurality of metal layers, or a plurality of metal alloy layers, or both.

19. A BAW resonator as claimed in claim 10, wherein the temperature compensation structure further comprises a third layer with acoustic impedance in a range of approximately 5 MR to approximately 120 MR.

20. A BAW resonator as claimed in claim 10, wherein the temperature compensation structure is disposed over the first electrode, and is in contact with the piezoelectric layer.

21. A BAW resonator as claimed in claim 20, wherein the first layer comprises a first dielectric material, and the second electrode comprises a second dielectric material.

22. A BAW resonator as claimed in claim 21, wherein the first dielectric material has an acoustic impedance in a range of approximately 5 MR to approximately 50 MR.

23. A BAW resonator as claimed in claim 21, wherein the first dielectric material comprises one of undoped silicate glass (USG) or tetraethyl orthosilicate (TEOS).

24. A BAW resonator as claimed in claim 21, wherein the second dielectric material has an acoustic impedance in a range of approximately 5 MR to approximately 60 MR.

25. A BAW resonator as claimed in claim 21, wherein the second dielectric material comprises one of non-etchable borosilicate glass (NEBSG), silicon carbide (SiC), aluminum oxide ($Al_2O_3$), diamond, diamond like carbon (DLC) and silicon nitride (SiN).

26. A BAW resonator as claimed in claim 20, wherein the temperature compensation structure further comprises a third layer with acoustic impedance in a range of approximately 5 MR to approximately 120 MR.

27. A BAW resonator as claimed in claim 10, wherein the temperature compensation structure is disposed beneath the second electrode, and is in contact with the piezoelectric layer.

28. A BAW resonator as claimed in claim 27, wherein the first layer comprises a first dielectric material, and the second electrode comprises a second dielectric material.

29. A BAW resonator as claimed in claim 28, wherein the first dielectric material has an acoustic impedance in a range of approximately 5 MR to approximately 60 MR.

30. A BAW resonator as claimed in claim 28, wherein the first dielectric material comprises one of undoped silicate glass (USG), or tetraethyl orthosilicate (TEOS).

31. A BAW resonator as claimed in claim 28, wherein the second dielectric material has an acoustic impedance in a range of approximately 5 MR to approximately 50 MR.

32. A BAW resonator as claimed in claim 28, wherein the second dielectric material comprises one of non-etchable borosilicate glass (NEBSG), silicon carbide (SiC), aluminum oxide ($Al_2O_3$), diamond, diamond like carbon (DLC) and silicon nitride (SiN).

33. A BAW resonator as claimed in claim 27, wherein the temperature compensation structure further comprises a third layer with acoustic impedance in a range of approximately 5 MR to approximately 120 MR.

34. A BAW resonator as claimed in claim 10, wherein the temperature compensation structure is buried in the piezoelectric layer.

35. A BAW resonator as claimed in claim 34, wherein the second layer substantially encapsulates the first layer.

36. A BAW resonator as claimed in claim 35, wherein the first layer has an acoustic impedance in a range of approximately 5 MR to approximately 50 MR.

37. A BAW resonator as claimed in claim 35, wherein the first layer comprises one of undoped silicate glass (USG), or tetraethyl orthosilicate (TEOS).

38. A BAW resonator as claimed in claim 35, wherein the second layer has an acoustic impedance in a range of approximately 5 MR to approximately 60 MR.

39. A BAW resonator as claimed in claim 35, wherein the second layer comprises one of non-etchable borosilicate glass (NEBSG), silicon carbide (SiC), aluminum oxide ($Al_2O_3$), diamond, diamond like carbon (DLC) and silicon nitride (SiN).

40. A BAW resonator as claimed in claim 34, wherein the temperature compensation structure further comprises a third layer with acoustic impedance in a range of approximately 5 MR to approximately 120 MR.

* * * * *